(12) United States Patent
Lin et al.

(10) Patent No.: US 12,490,498 B2
(45) Date of Patent: Dec. 2, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Chun-Yen Lin, Hsinchu (TW); Wei-Cheng Lin, Taichung (TW); Jiann-Tyng Tzeng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 376 days.

(21) Appl. No.: 18/327,787

(22) Filed: Jun. 1, 2023

(65) Prior Publication Data
US 2024/0404886 A1    Dec. 5, 2024

(51) Int. Cl.
| | |
|---|---|
| H10D 84/03 | (2025.01) |
| H10D 30/67 | (2025.01) |
| H10D 84/01 | (2025.01) |
| H10D 84/83 | (2025.01) |

(52) U.S. Cl.
CPC ....... H10D 84/038 (2025.01); H10D 30/6735 (2025.01); H10D 84/013 (2025.01); H10D 84/0151 (2025.01); H10D 84/83 (2025.01)

(58) Field of Classification Search
CPC ............. H10D 84/038; H10D 30/6735; H10D 84/013; H10D 84/0151; H10D 84/83; H10D 30/6757; H10D 30/501–509; H10D 30/43–435; H10D 62/119–123; H10D 30/014; H10D 84/0188
See application file for complete search history.

(56) References Cited

U.S. PATENT DOCUMENTS

| | | | | |
|---|---|---|---|---|
| 2023/0009388 | A1* | 1/2023 | Ji | H10D 84/038 |
| 2023/0253404 | A1* | 8/2023 | Gardner | H10D 30/6735 |
| | | | | 257/369 |
| 2023/0361112 | A1* | 11/2023 | Hong | H10D 88/00 |
| 2025/0204038 | A1* | 6/2025 | Park | H10D 84/038 |

* cited by examiner

Primary Examiner — Shahed Ahmed
(74) Attorney, Agent, or Firm — Maschoff Brennan

(57) ABSTRACT

A method includes: forming a first channel structure through a first gate structure; forming a first source/drain structure coupled to the first channel structure at a first surface of the first gate structure; before the first source/drain structure is formed, forming a first isolation layer at a second surface of the first gate structure to isolate the first channel structure; and after the first source/drain structure is formed, forming a first insulation structure at a position of the first isolation layer. The first surface and the second surface are opposite to each other, and a size of the first insulation structure is equal to or larger than a size of the first source/drain structure.

20 Claims, 22 Drawing Sheets

SEMICONDUCTOR DEVICE AND MANUFACTURING METHOD THEREOF

BACKGROUND

In complementary field-effect transistor (CFET) architecture, due to unbalance of P-type devices and N-type devices (for example, the P-type devices and the N-type devices have different speeds), skew cells are used to balance the P-type devices and the N-type devices. In some skew cells, numbers of the P-type devices and the N-type devices are different. Accordingly, some devices are not functional and become dummy devices in the skew cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
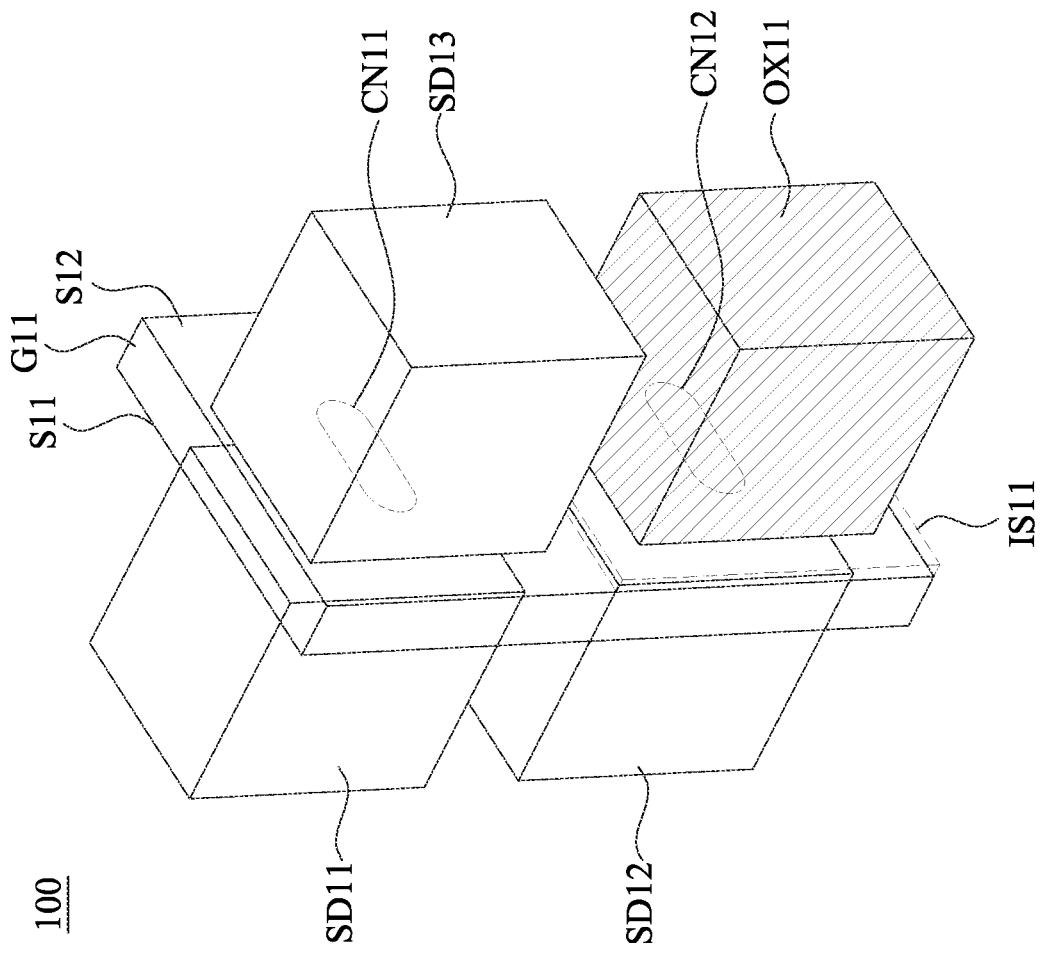
FIG. 1 is a three-dimensional schematic diagram of a semiconductor device, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a three-dimensional schematic diagram of a semiconductor device 100, in accordance with some embodiments of the present disclosure. As illustratively shown in FIG. 1, the semiconductor device 100 includes a gate structure G11, source/drain structures SD11-SD13, channel structures CN11, CN12 and an insulation structure OX11. In some embodiments, the semiconductor device 100 includes an isolation layer IS11 during a manufacturing process of the semiconductor device 100. In some embodiments, the isolation layer IS11 is removed after the manufacturing process.

As illustratively shown in FIG. 1, the gate structure G11 extends along a Y direction and a Z direction. Alternatively stated, the gate structure G11 extends along the Y-Z plane. The gate structure G11 has two surfaces S11 and S12 which are opposite to each other along an X direction. Each of the surfaces S11 and S12 also extends along the Y-Z plane. In some embodiments, the Y direction, the X direction and the Z direction are perpendicular with each other.

As illustratively shown in FIG. 1, each of the source/drain structures SD11 and SD12 is formed at the surface S11. The source/drain structures SD12 and SD11 are arranged in order along the Z direction. Each of the source/drain structure SD13 and the insulation structure OX11 is formed at the surface S12. The insulation structure OX11 and the source/drain structure SD13 are arranged in order along the Z direction. Along the X direction, the gate structure G11 is sandwiched between the source/drain structures SD11 and SD12, and is sandwiched between the insulation structure OX11 and the source/drain structure SD13.

As illustratively shown in FIG. 1, each of the channel structures CN11 and CN12 is surrounded by the gate structure G11, and is formed from the surface S11 through the gate structure G11 to the surface S12. The channel structure CN11 is coupled to the source/drain structures SD11 and SD13 at the surfaces S11 and S12, respectively. In some embodiments, the gate structure G11 and the source/drain structures SD11, SD13 are configured to operate as a transistor, and correspond to a control terminal and two source/drain terminals of the transistor, respectively. The channel structure CN12 is coupled to the source/drain structure SD12 at the surface S11. In some embodiments, the channel structure CN12 contacts with the insulation structure OX11.

In some embodiments, each of the source/drain structures SD11-SD13 is formed by an epitaxial growth process, and is referred to as an epitaxial structure. In some embodiments, the source/drain structures SD11 and SD13 have a first conductive type, and the source/drain structure SD12 has a second conductive type different from the first conductive type. For example, each of the source/drain structures SD11 and SD13 is formed by N-type doped material, and the source/drain structure SD12 is formed by P-type doped material.

In some embodiments, during the manufacturing process, the isolation layer IS11 is formed at the surface S12. In some embodiments, the source/drain structure SD13 is formed from the channel CN11 by an epitaxial growth process, and grows along the X direction. During the epitaxial growth process, the isolation layer IS11 isolates the channel CN12 to avoid a source/drain structure forming from the channel CN12 at the surface S12. After the epitaxial growth process, the isolation layer IS11 is removed and the insulation structure OX11 is formed at the position of the isolation layer IS11.

As illustratively shown in FIG. 1, the insulation structure OX11 is formed to fill the space below the source/drain structure SD13 and opposite to the source/drain structure SD12. The insulation structure OX11 has a size equal to or larger than the source/drain structure SD12. For example, along the Y-Z plane, an area of the insulation structure OX11 is equal to or larger than an area of the source/drain structure SD12. In some embodiments, the insulation structure OX11 does not be capacitive coupled to other elements of the semiconductor device 100.

In some approaches, source/drain structures form from the channels during an epitaxial growth process. Some of the source/drain structures are referred to as dummy devices and are not functional. The source/drain structures of the dummy devices are capacitive coupled to surrounding elements, such as gate structures and metals, such that undesired extra cell capacitors are induced.

Compared to the above approaches, in some embodiments of the present disclosure, the isolation layer IS11 isolates the channel CN12 to avoid formation of source/drain structures of the dummy devices. Instead of the source/drain structures of the dummy devices, the insulation structure OX11 is formed. The insulation structure OX11 does not being capacitive coupled to surrounding elements. As a result, undesired cell capacitors of the semiconductor device 100 are reduced.

In some embodiments, the insulation structure OX11 is implemented by shallow trench isolation (STI) oxide materials, such as silicon dioxide. The isolation layer IS11 is implemented by aluminum oxide materials.

FIG. 2A is a cross section diagram of a semiconductor device 200 corresponding to the semiconductor device 100 shown in FIG. 1, in accordance with some embodiments of the present disclosure. The X direction points out from the paper in FIG. 2A.

As illustratively shown in FIG. 2A, the semiconductor device 200 includes source/drain structures SD21, SD22, conductive segments MD21, MD22, M21, M22, vias VD21, VD22 and an insulation structure OX21. The conductive segment M22, the via VD22, the conductive segment MD22, the source/drain structures SD22, SD21, the conductive segment MD21, the via VD21 and the conductive segment M21 are arranged in order along the Z direction. The insulation structure OX21 is formed between the source/drain structures SD22 and SD21, to isolate the source/drain structure SD22 and the conductive segment MD22 from the source/drain structure SD21 and the conductive segment MD21.

In some embodiments, the via VD22 is configured to couple the conductive segments M22 and MD22 to each other. The conductive segment MD22 is coupled to the source/drain structure SD22. The via VD21 is configured to couple the conductive segments M21 and MD21 to each other. The conductive segment MD21 is coupled to the source/drain structure SD21. In some embodiments, the conductive segments M21 and M22 are operate as signal lines, the source/drain structure SD21 is configured to receive a signal from the conductive segment M21, and the source/drain structure SD22 is configured to receive a signal from the conductive segment M22.

Referring to FIG. 1 and FIG. 2A, the semiconductor device 200 is an embodiment of the semiconductor device 100. The cross section diagram shown in FIG. 2A corresponds to the surface S11. The source/drain structures SD21 and SD22 are embodiments of the source/drain structures SD11 and SD12, respectively. For example, the source/drain structures SD21 and SD22 are coupled to the channel structures CN11 and CN12, respectively. The conductive segments M21-M23 are coupled to the source/drain structures SD11-SD13, respectively. Therefore, some descriptions are not repeated for brevity.

FIG. 2B is a cross section diagram of the semiconductor device 200 corresponding to the semiconductor device 100 shown in FIG. 1, in accordance with some embodiments of the present disclosure. The X direction points out from the paper in FIG. 2B.

As illustratively shown in FIG. 2B, the semiconductor device 200 further includes a source/drain structure SD23, a conductive segment MD23, vias VD23, VD24 and an insulation structure OX22. The conductive segment M22, the via VD24, the source/drain structures SD23, the conductive segment MD23, the via VD23 and the conductive segment M21 are arranged in order along the Z direction. The insulation structure OX22 is formed between the source/drain structure SD23 and the via VD24, to fill the space between the source/drain structure SD23 and the via VD24, and isolate the source/drain structure SD23 and the via VD24 from each other. In some embodiments, the insulation structure OX22 contacts with the via VD24.

Referring to FIG. 2A and FIG. 2B, along the Y-Z plane, an area of the insulation structure OX22 is approximately equal to an area of the insulation structure OX21 plus an area of the source/drain structures SD22 and an area of the conductive segment MD22. In some embodiments, a volume of the insulation structure OX22 is approximately equal to a volume of the insulation structure OX21 plus a volume of the source/drain structures SD22 and a volume of the conductive segment MD22.

In some embodiments, the via VD23 is configured to couple the conductive segments M21 and MD23 to each other. The conductive segment MD23 is coupled to the source/drain structure SD23. In some embodiments, the source/drain structure SD23 is configured to receive the signal from the conductive segment M21.

Referring to FIG. 1 and FIG. 2B, the cross section diagram shown in FIG. 2B corresponds to the surface S12. The source/drain structure SD23 and the insulation structure OX22 are embodiments of the source/drain structure SD13 and the insulation structure OX11, respectively. For example, the source/drain structure SD23 is coupled to the channel structure CN11, and the insulation structure OX22 fills the space below the source/drain structure SD13. Therefore, some descriptions are not repeated for brevity.

Figure 2:
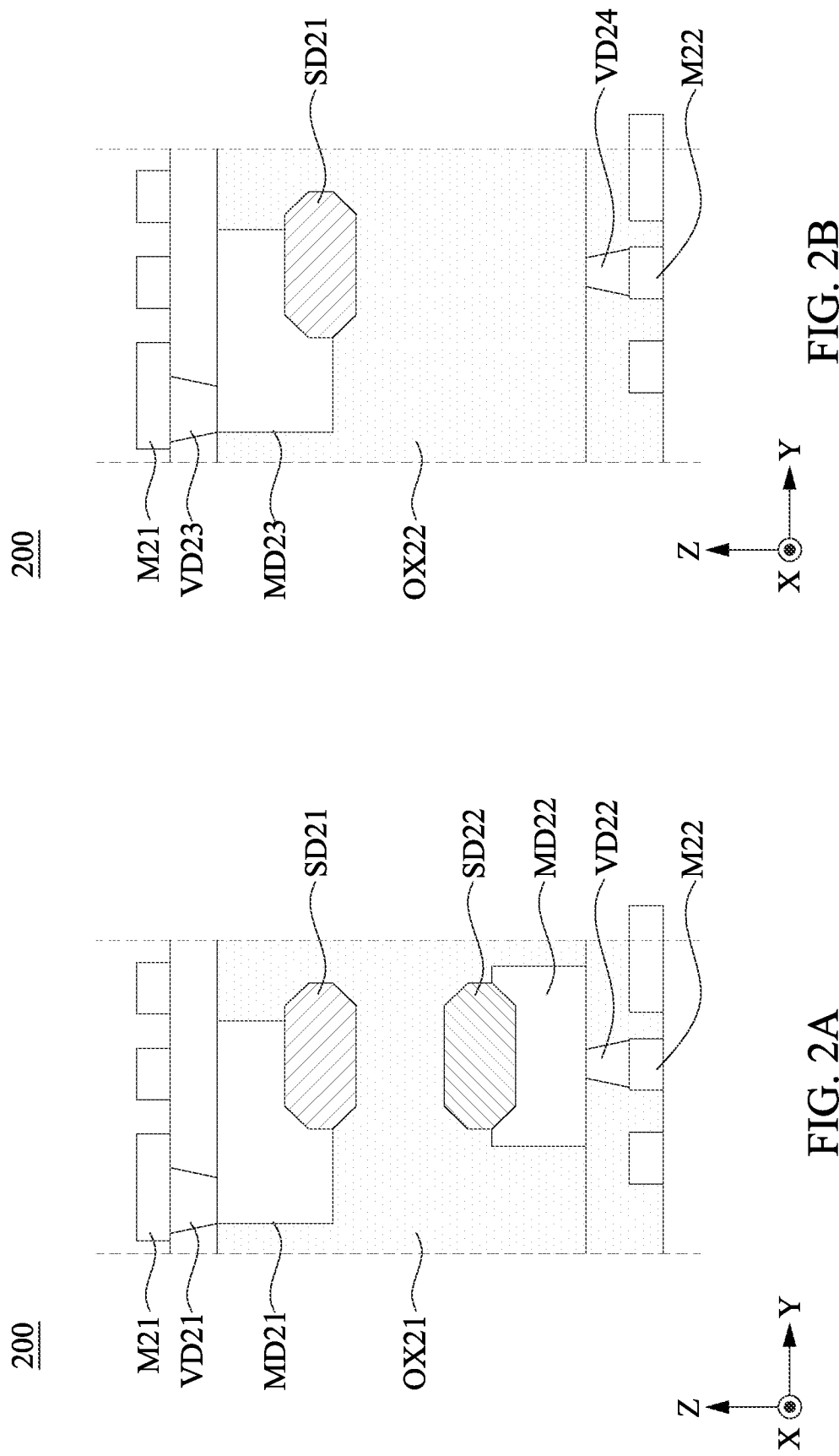
FIG. 2A is a cross section diagram of a semiconductor device corresponding to the semiconductor device shown in FIG. 1, in accordance with some embodiments of the present disclosure.
FIG. 2B is a cross section diagram of the semiconductor device corresponding to the semiconductor device shown in FIG. 1, in accordance with some embodiments of the present disclosure.
Figure 3:
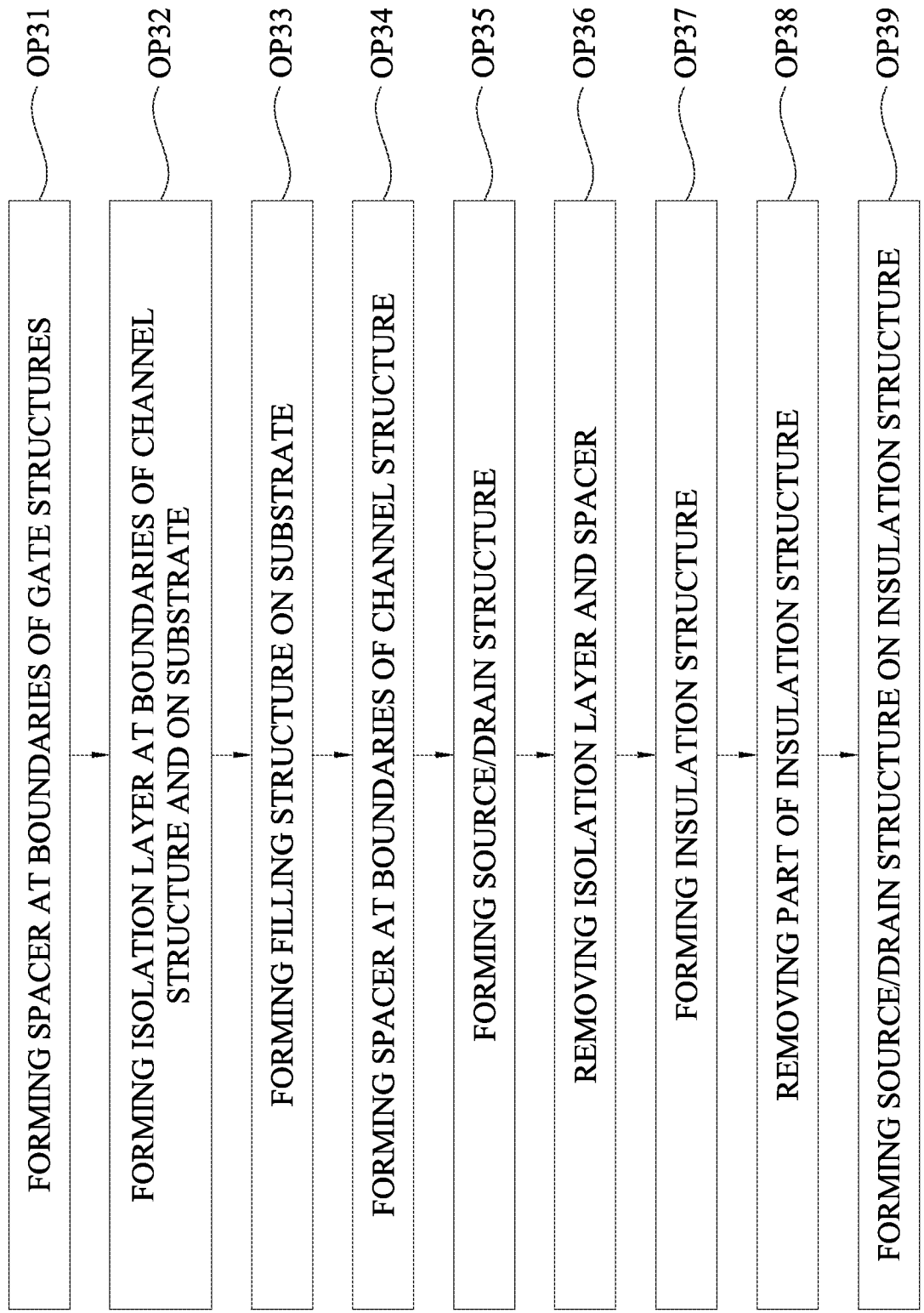
FIG. 3 is a flowchart diagram of a method of manufacturing a semiconductor device shown in FIG. 4A to FIG. 4I, in accordance with some embodiments of the present disclosure.

FIG. 3 is a flowchart diagram of a method 300 of manufacturing a semiconductor device 400 shown in FIG. 4A to FIG. 4I, in accordance with some embodiments of the present disclosure. As illustratively shown in FIG. 3, the method 300 includes operations OP31-OP39. In some embodiments, the operations OP31-OP36 are performed in order. Further details of the operations OP31-OP39 are described with the embodiments associated with FIG. 4A to FIG. 4I as following. Referring to FIG. 1 to FIG. 3, in various embodiments, at least one of the semiconductor devices 100 and 200 is manufactured by at least a part of the method 300.

Figure 4A:
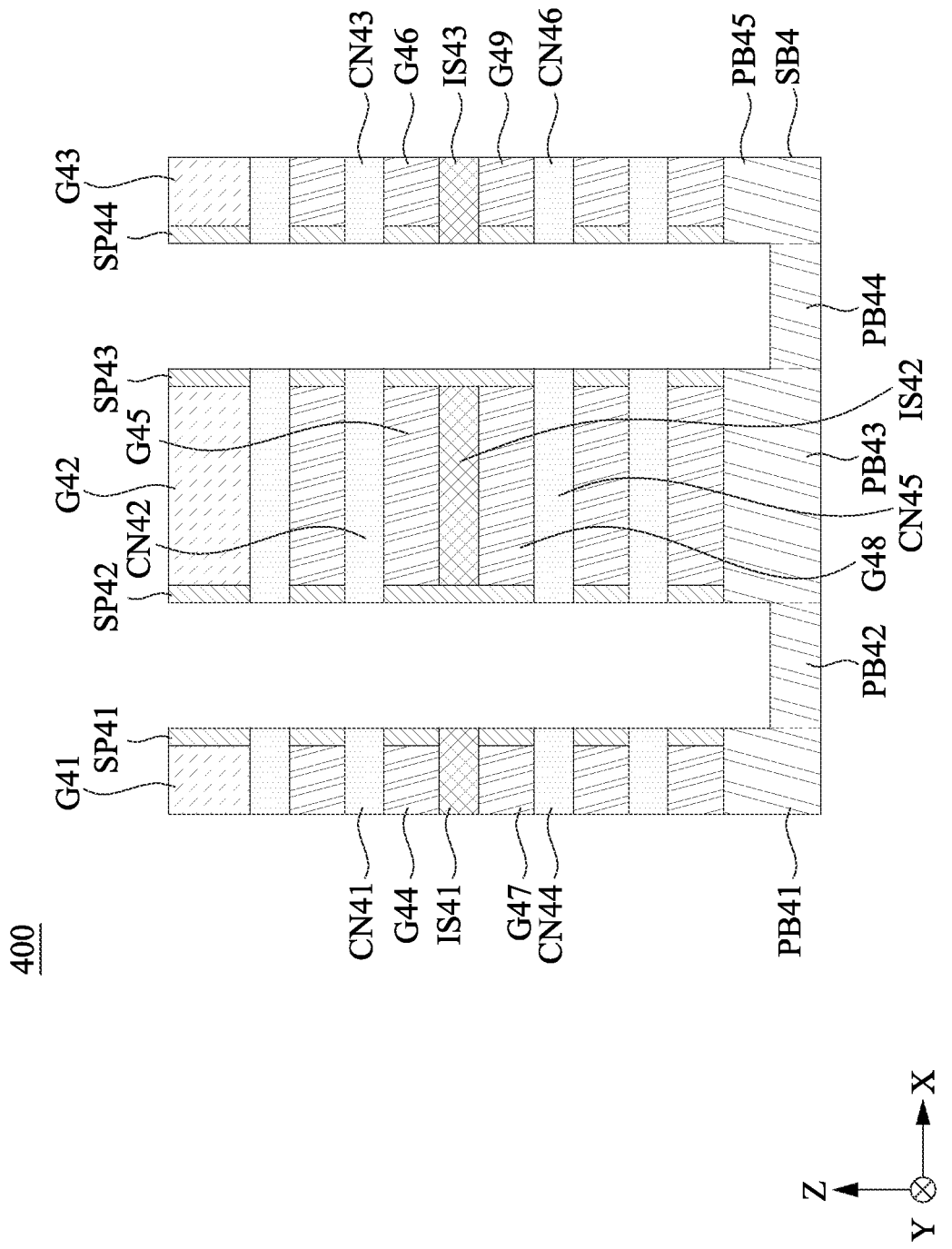
FIG. 4A to FIG. 4I are a cross section diagrams of the semiconductor device 400 corresponding to the method shown in FIG. 3, in accordance with some embodiments of the present disclosure.

FIG. 4A is a cross section diagram of the semiconductor device 400 corresponding to the method 300 shown in FIG. 3, in accordance with some embodiments of the present disclosure. The Y direction points into the paper in FIG. 4A. Referring to FIG. 4A and FIG. 3, the cross section diagram shown in FIG. 4A corresponds to an intermediate state of the semiconductor device 400 during a manufacturing process of the method 300.

As illustratively shown in FIG. 4A, the semiconductor device 400 includes a substrate SB4, gate structures G41-G49, spacers SP41-SP44, isolation structures IS41-IS43 and channel structures CN41-CN46. The substrate SB4 includes substrate portions PB41-PB45. The substrate portions PB41-PB45 are arranged in order along the X direction. Along the Z direction, heights of the substrate portions PB41, PB43 and PB45 are approximately the same, and each of heights of the substrate portions PB42 and PB44 is shorter than the height of the substrate portion PB43.

As illustratively shown in FIG. 4A, the gate structure G47, the isolation structure IS41 and the gate structures G44, G41 are formed on the substrate portion PB41, and are arranged in order along the Z direction. The isolation structure IS41 is configured to isolate the gate structures G44 and G47 from each other. The spacer SP41 is formed at boundaries of the gate structures G41, G44 and G47. The channel structure CN41 is formed through the gate structure G44 and the spacer SP41. The channel structure CN44 is formed through the gate structure G47 and the spacer SP41. The channel structures CN41 and CN44 are coupled to the gate structures G44 and G47, respectively.

As illustratively shown in FIG. 4A, the gate structure G48, the isolation structure IS42 and the gate structures G45, G42 are formed on the substrate portion PB43, and are arranged in order along the Z direction. The isolation structure IS42 is configured to isolate the gate structures G45 and G48 from each other. The spacer SP42 is formed at boundaries of the gate structures G42, G45 and G48. The spacer SP43 is formed at opposite boundaries of the gate structures G42, G45 and G48. The channel structure CN42 is formed through the gate structure G45 and the spacers SP42, SP43. The channel structure CN45 is formed through the gate structure G48 and the spacers SP42, SP43. The channel structures CN42 and CN45 are coupled to the gate structures G45 and G48, respectively.

As illustratively shown in FIG. 4A, the gate structure G49, the isolation structure IS43 and the gate structures G46, G43 are formed on the substrate portion PB45, and are arranged in order along the Z direction. The isolation structure IS43 is configured to isolate the gate structures G46 and G49 from each other. The spacer SP44 is formed at boundaries of the gate structures G43, G46 and G49. The channel structure CN43 is formed through the gate structure G46 and the spacer SP44. The channel structure CN46 is formed through the gate structure G49 and the spacer SP44. The channel structures CN43 and CN46 are coupled to the gate structures G46 and G49, respectively.

In some embodiments, the gate structures G41-G43 are implemented by polycrystalline silicon. The gate structures G44-G49 are implemented by silicon germanium. The channel structures CN41-CN46 are implemented by silicon.

Referring to FIG. 4A and FIG. 3, the cross section diagram shown in FIG. 4A corresponds to the operation OP31. At the operation OP31, the spacers SP41-SP44 are formed. In some embodiments, the spacers SP41-SP44 are formed by deposition process. In some embodiments, before the operation OP31, the substrate SB4, the gate structures G41-G49, the isolation structures IS41-IS43 and the channel structures CN41-CN46 are formed.

Figure 4B:
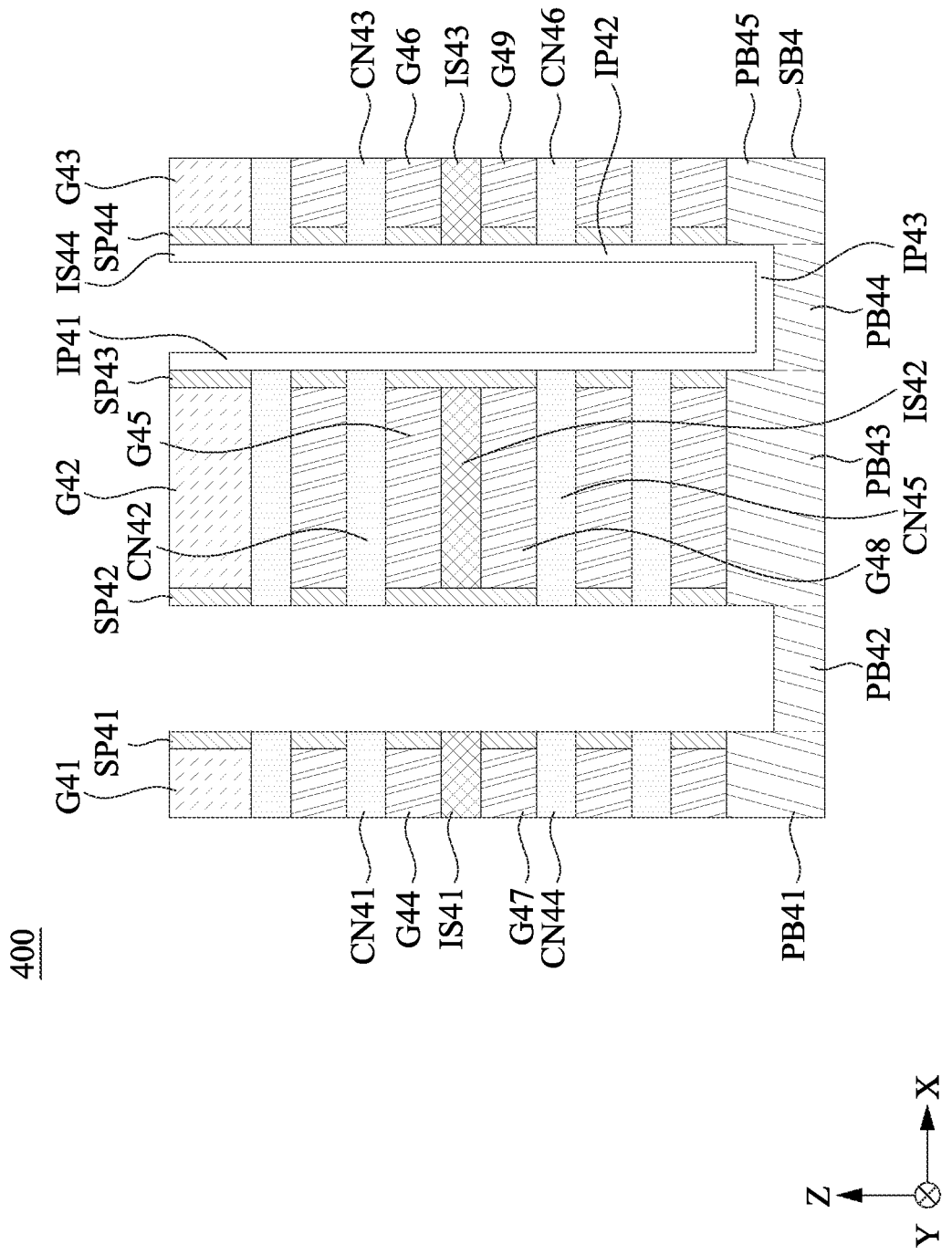

FIG. 4B is a cross section diagram of the semiconductor device 400 corresponding to the method 300 shown in FIG. 3, in accordance with some embodiments of the present disclosure. The Y direction points into the paper in FIG. 4B.

Referring to FIG. 4B and FIG. 3, the cross section diagram shown in FIG. 4B corresponds to an intermediate state of the semiconductor device 400 during a manufacturing process of the method 300.

As illustratively shown in FIG. 4B, the semiconductor device 400 further includes an isolation layer IS44. Referring to FIG. 4B and FIG. 3, the cross section diagram shown in FIG. 4B corresponds to the operation OP32. At the operation OP32, the isolation layer IS44 is formed. In some embodiments, the isolation layer IS44 is formed by deposition process.

As illustratively shown in FIG. 4B, the isolation layer IS44 includes isolation portions IP41-IP43. Each of the isolation portions IP41 and IP42 extends along the Z direction, and is formed on the substrate portion PB44. The isolation portion IP41 is formed at right boundaries of the channel structures CN42 and CN45. The isolation portion IP42 is formed at left boundaries of the channel structures CN43 and CN46. The isolation portion IP43 extends along the X direction, and is formed between the isolation portions IP41 and IP42. Two terminals of the isolation portion IP43 are connected with the isolation portions IP41 and IP42, respectively. In some embodiments, the isolation portions IP41-IP43 contacts with the channel structures CN45, CN46 and the substrate portion PB44, respectively.

Figure 4C:
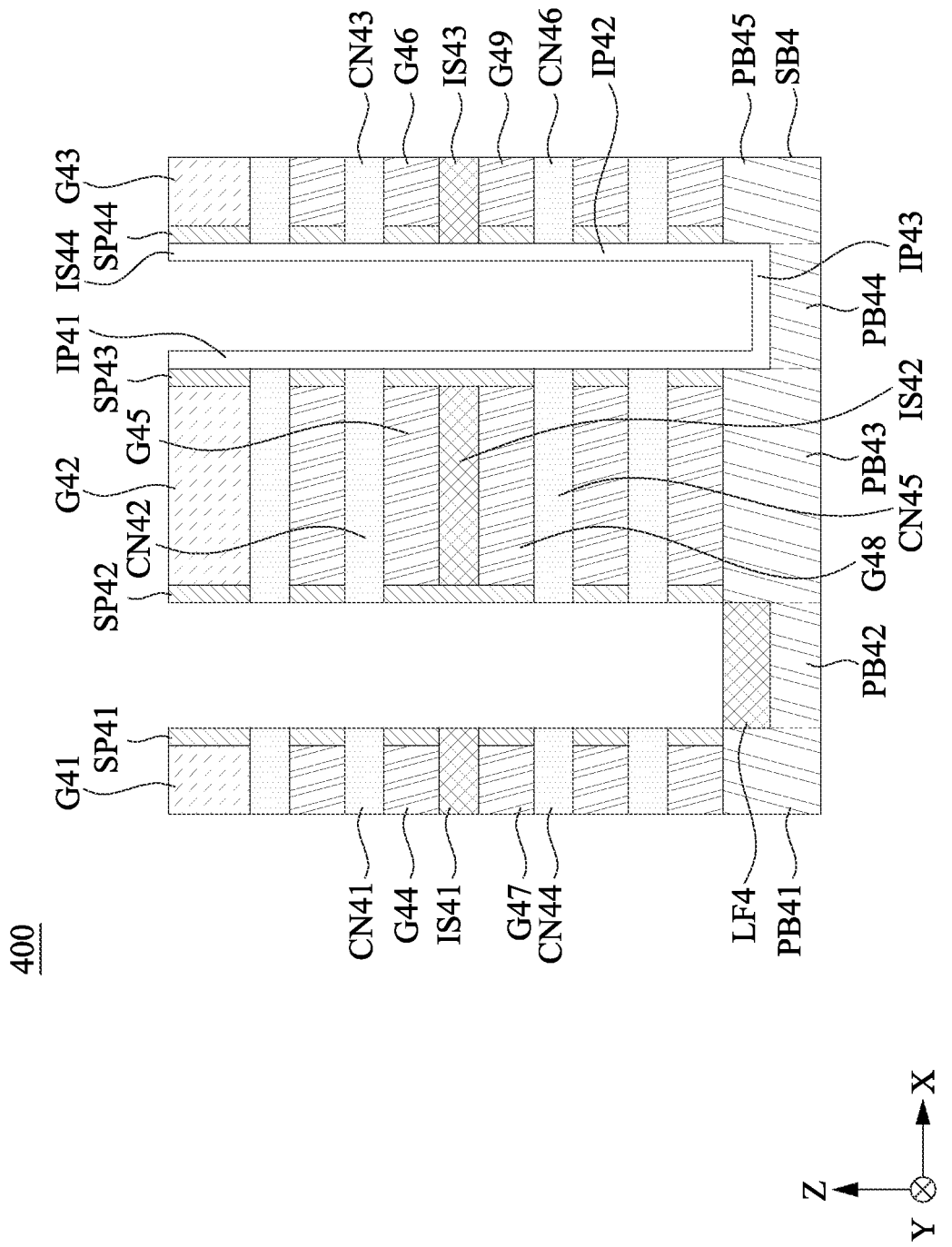

FIG. 4C is a cross section diagram of the semiconductor device 400 corresponding to the method 300 shown in FIG. 3, in accordance with some embodiments of the present disclosure. The Y direction points into the paper in FIG. 4C. Referring to FIG. 4C and FIG. 3, the cross section diagram shown in FIG. 4C corresponds to an intermediate state of the semiconductor device 400 during a manufacturing process of the method 300.

As illustratively shown in FIG. 4C, the semiconductor device 400 further includes a filling structure LF4. Referring to FIG. 4C and FIG. 3, the cross section diagram shown in FIG. 4C corresponds to the operation OP33. At the operation OP33, the filling structure LF4 is formed.

As illustratively shown in FIG. 4C, the filling structure LF4 is formed on the substrate portion PB42 and between the substrate portion PB41 and PB43. Along the Z direction, a height of the filling structure LF4 plus the height of the substrate portion PB42 is approximately equal to the height of the substrate portion PB43, and the isolation portion IP43 is lower than an upper boundary of the filling structure LF4. In some embodiments, the filling structure LF4 contacts with each of the substrate portion PB41-PB43. In some embodiments, the filling structure LF4 is implemented by isolation materials, such as materials of the isolation structures IS41-IS43.

Figure 4D:
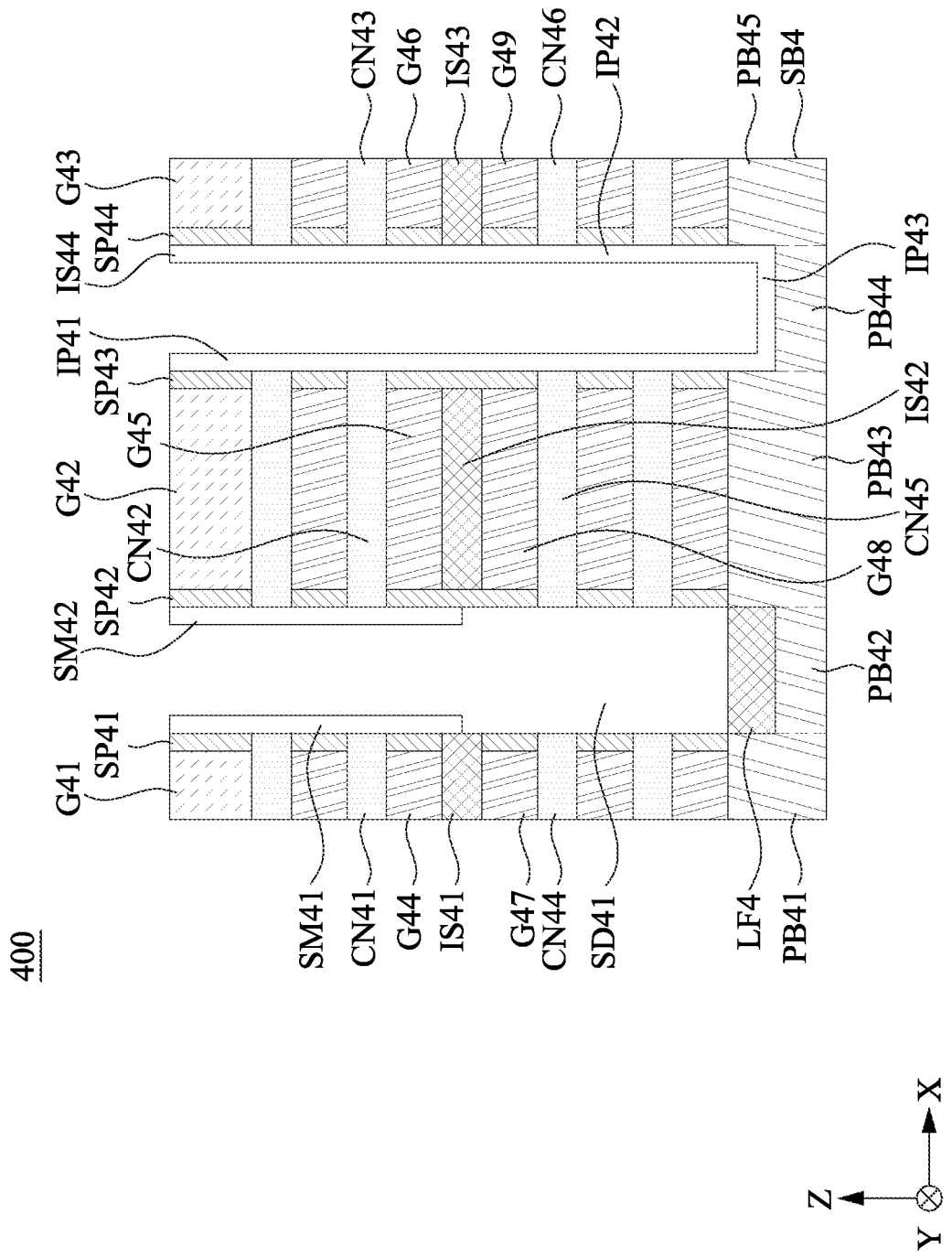

FIG. 4D is a cross section diagram of the semiconductor device 400 corresponding to the method 300 shown in FIG. 3, in accordance with some embodiments of the present disclosure. The Y direction points into the paper in FIG. 4D. Referring to FIG. 4D and FIG. 3, the cross section diagram shown in FIG. 4D corresponds to an intermediate state of the semiconductor device 400 during a manufacturing process of the method 300.

As illustratively shown in FIG. 4D, the semiconductor device 400 further includes spacers SM41 and SM42. Referring to FIG. 4D and FIG. 3, the cross section diagram shown in FIG. 4D corresponds to the operation OP34. At the operation OP34, the spacers SM41 and SM42 are formed.

As illustratively shown in FIG. 4D, the spacer SM41 is formed at right boundaries of the channel CN41 and the spacer SP41. The spacer SM42 is formed at left boundaries of the channel CN42 and the spacer SP42. In some embodiments, the spacer SM41 contacts with the right boundaries of the channel CN41 and the spacer SP41, and the spacer SM42 contacts with the left boundaries of the channel CN42 and the spacer SP42.

Figure 4E:
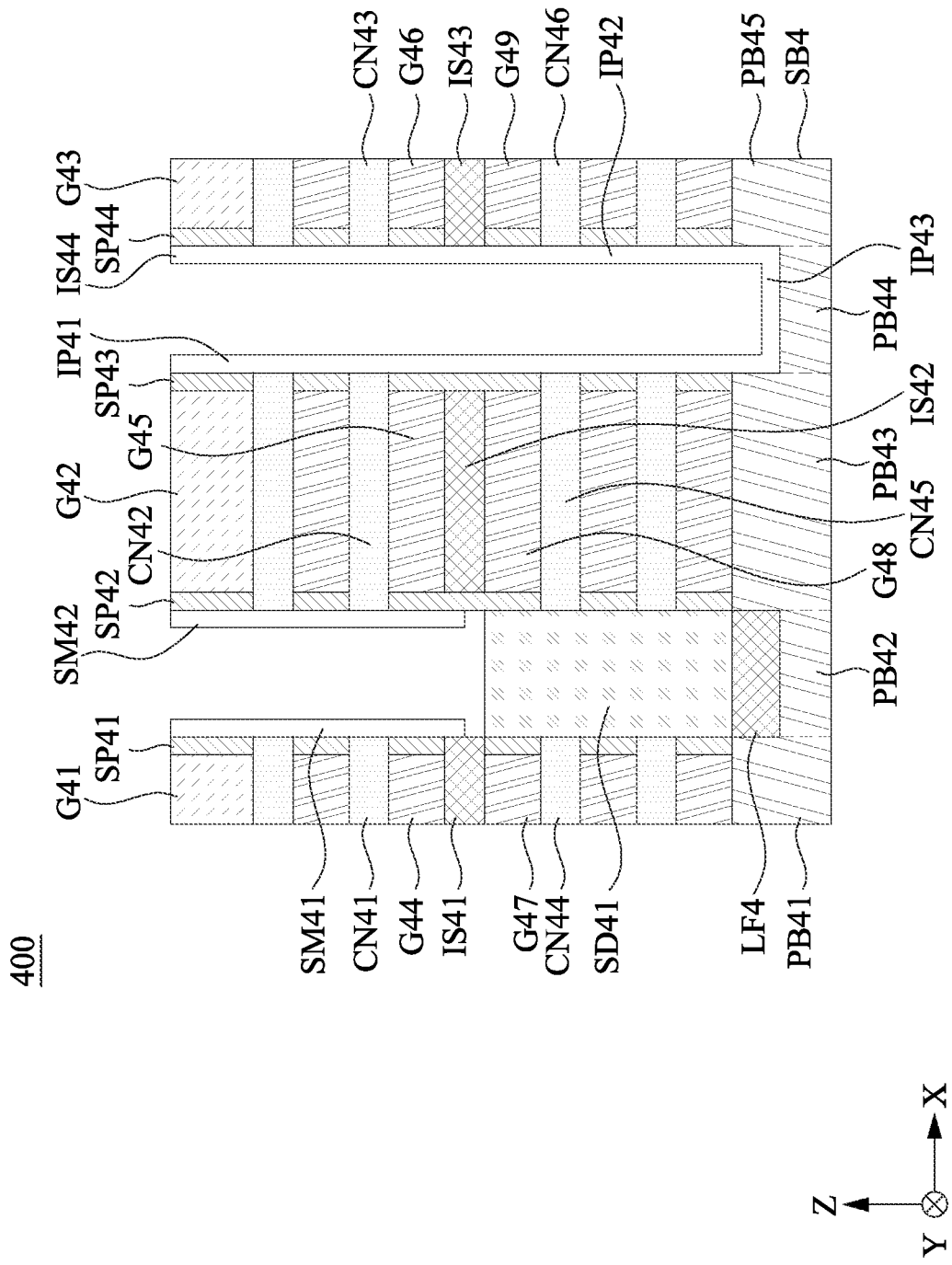

FIG. 4E is a cross section diagram of the semiconductor device 400 corresponding to the method 300 shown in FIG. 3, in accordance with some embodiments of the present disclosure. The Y direction points into the paper in FIG. 4E. Referring to FIG. 4E and FIG. 3, the cross section diagram shown in FIG. 4E corresponds to an intermediate state of the semiconductor device 400 during a manufacturing process of the method 300.

As illustratively shown in FIG. 4E, the semiconductor device 400 further includes a source/drain structure SD41. Referring to FIG. 4E and FIG. 3, the cross section diagram shown in FIG. 4E corresponds to the operation OP35. At the operation OP35, the source/drain structure SD41 is formed. The source/drain structure SD41 is coupled to right boundaries of the channel structure CN44 and left boundaries of the channel structure CN45.

In some embodiments, the source/drain structure SD41 is formed from the channel structures CN44 and CN45 in the space between the channel structures CN44 and CN45, by an epitaxial growth process. During the epitaxial growth process, the spacers SM41 and SM42 isolate the channel structures CN41 and CN42, respectively, to avoid source/drain structures formed from the channel structures CN41 and CN42. During the epitaxial growth process, the isolation layer IS44 isolate the channel structures CN42, CN43, CN45 and CN46, to avoid source/drain structures formed from the channel structures CN42, CN43, CN45 and CN46 in the space between the channel structures CN45 and CN46.

Figure 4F:
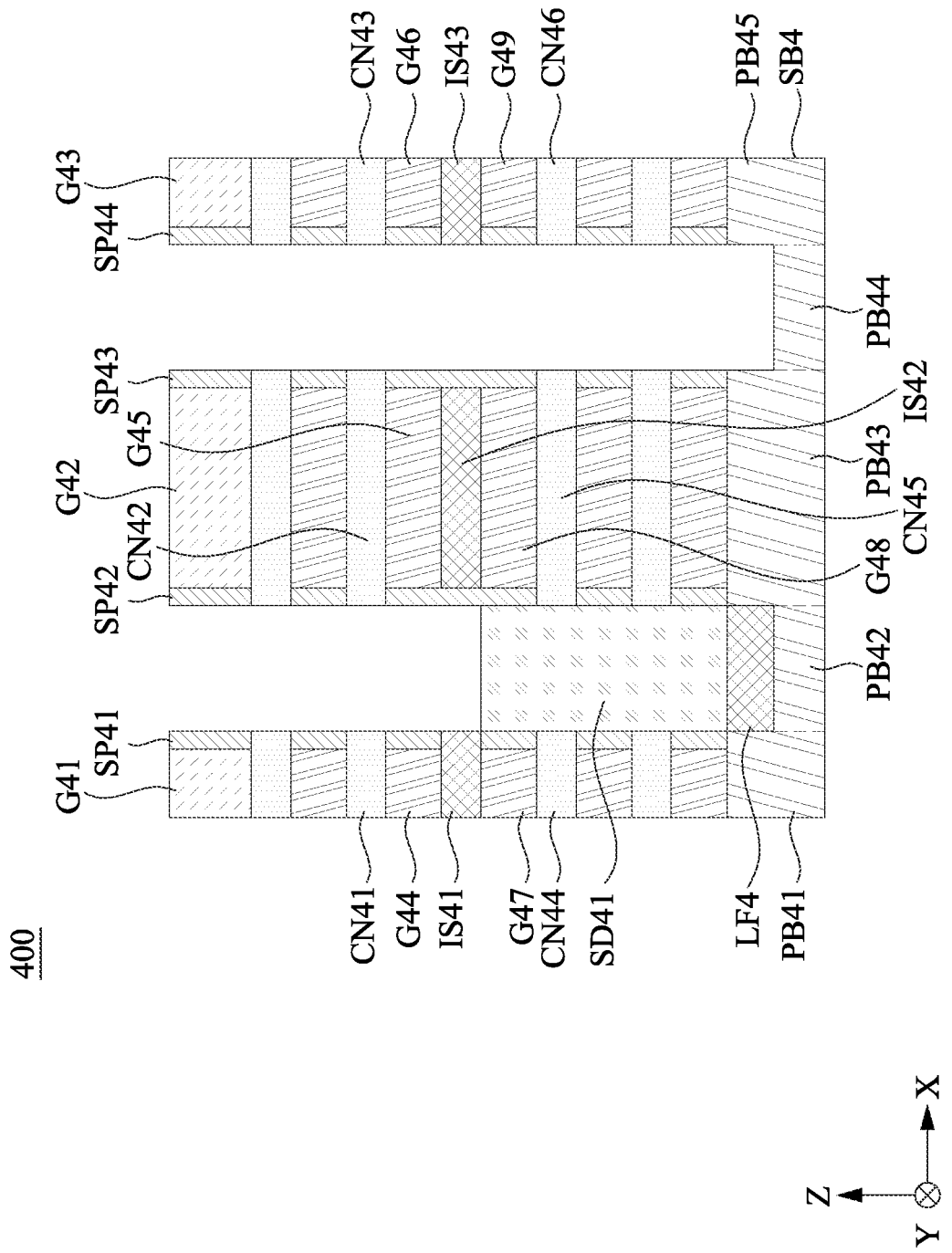

FIG. 4F is a cross section diagram of the semiconductor device 400 corresponding to the method 300 shown in FIG. 3, in accordance with some embodiments of the present disclosure. The Y direction points into the paper in FIG. 4E. Referring to FIG. 4F and FIG. 3, the cross section diagram shown in FIG. 4F corresponds to an intermediate state of the semiconductor device 400 during a manufacturing process of the method 300, and corresponds to the operation OP36. At the operation OP36, the isolation layers IS41 and spacers SM41, SM42 are removed from the semiconductor device 400.

Figure 4G:
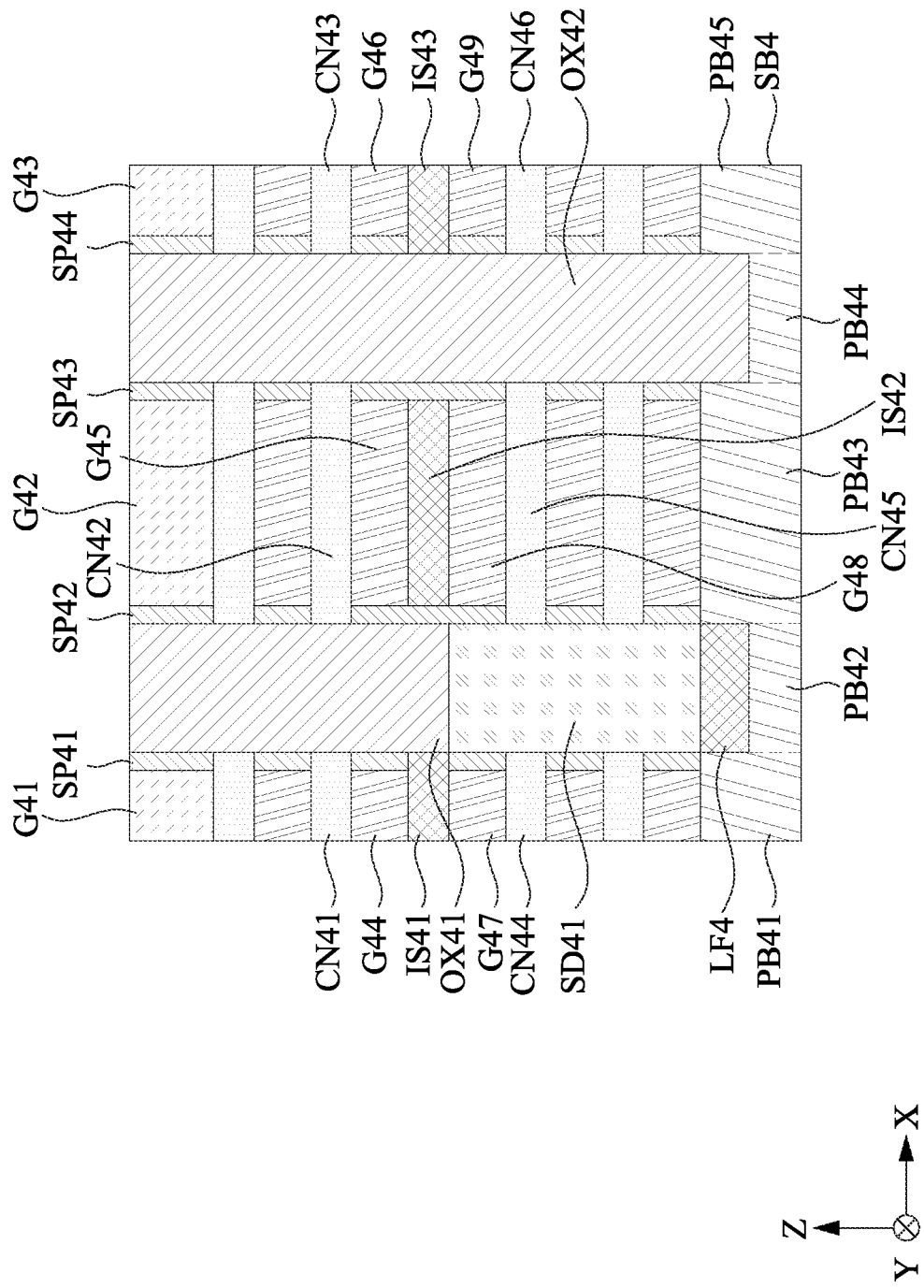

FIG. 4G is a cross section diagram of the semiconductor device 400 corresponding to the method 300 shown in FIG. 3, in accordance with some embodiments of the present disclosure. The Y direction points into the paper in FIG. 4G. Referring to FIG. 4G and FIG. 3, the cross section diagram shown in FIG. 4G corresponds to an intermediate state of the semiconductor device 400 during a manufacturing process of the method 300.

As illustratively shown in FIG. 4G, the semiconductor device 400 further includes insulation structures OX41 and OX42. Referring to FIG. 4G and FIG. 3, the cross section diagram shown in FIG. 4G corresponds to the operation OP37. At the operation OP37, the insulation structures OX41 and OX42 are formed. In some embodiments, the insulation structures OX41 and OX42 are formed simultaneously by deposition process and chemical-mechanical polishing (CMP) process.

As illustratively shown in FIG. 4G, the insulation structure OX41 is formed on the source/drain structure SD41 and between the spacers SP41 and SP42. Along the X direction, a width of the insulation structure OX41 is approximately equal to a width of the source/drain structure SD41. The insulation structure OX42 is formed on the substrate portion PB44 and between the spacers SP43 and SP44. Along the X direction, a width of the insulation structure OX42 is approximately equal to the width of the source/drain structure SD41. Along the Z direction, a height of the insulation structure OX42 is larger than a height of the insulation structure OX41 plus a height of the source/drain structure SD41.

Figure 4H:
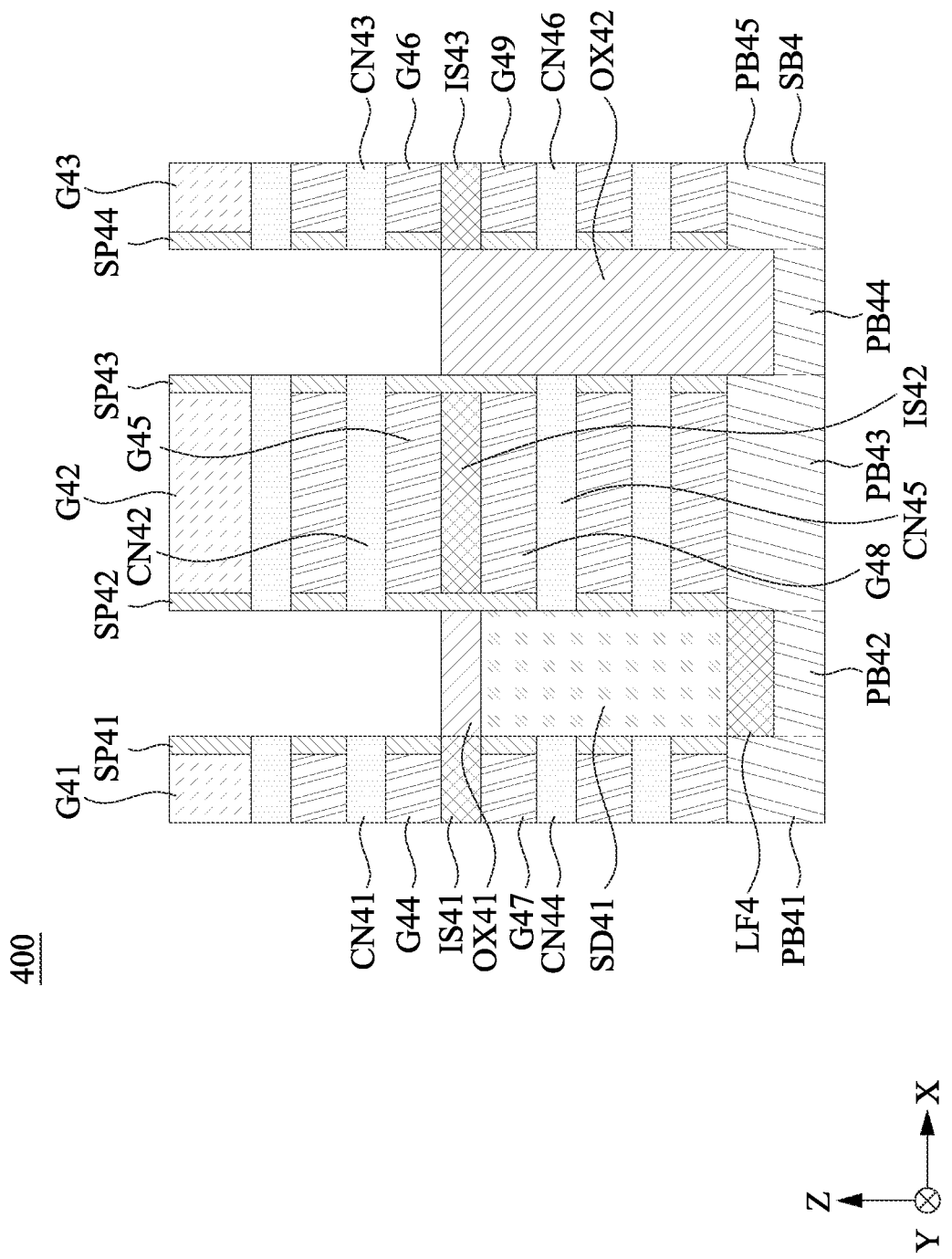

FIG. 4H is a cross section diagram of the semiconductor device 400 corresponding to the method 300 shown in FIG. 3, in accordance with some embodiments of the present disclosure. The Y direction points into the paper in FIG. 4H. Referring to FIG. 4H and FIG. 3, the cross section diagram shown in FIG. 4H corresponds to an intermediate state of the semiconductor device 400 during a manufacturing process of the method 300, and corresponds to the operation OP38. At the operation OP38, parts of the insulation structures OX41 and OX42 are removed. In some embodiments, the parts of the insulation structures OX41 and OX42 are removed by an etching process.

As illustratively shown in FIG. 4H, after the etching process, along the Z direction, a height of the insulation structure OX41 is approximately equal to a height of the isolation structure IS42, and each of upper boundaries of the insulation structures OX41 and OX42 is aligned with an upper boundary of the isolation structure IS42. The height of the insulation structure OX42 is still larger than the height of the insulation structure OX41 plus the height of the source/drain structure SD41.

Figure 4I:
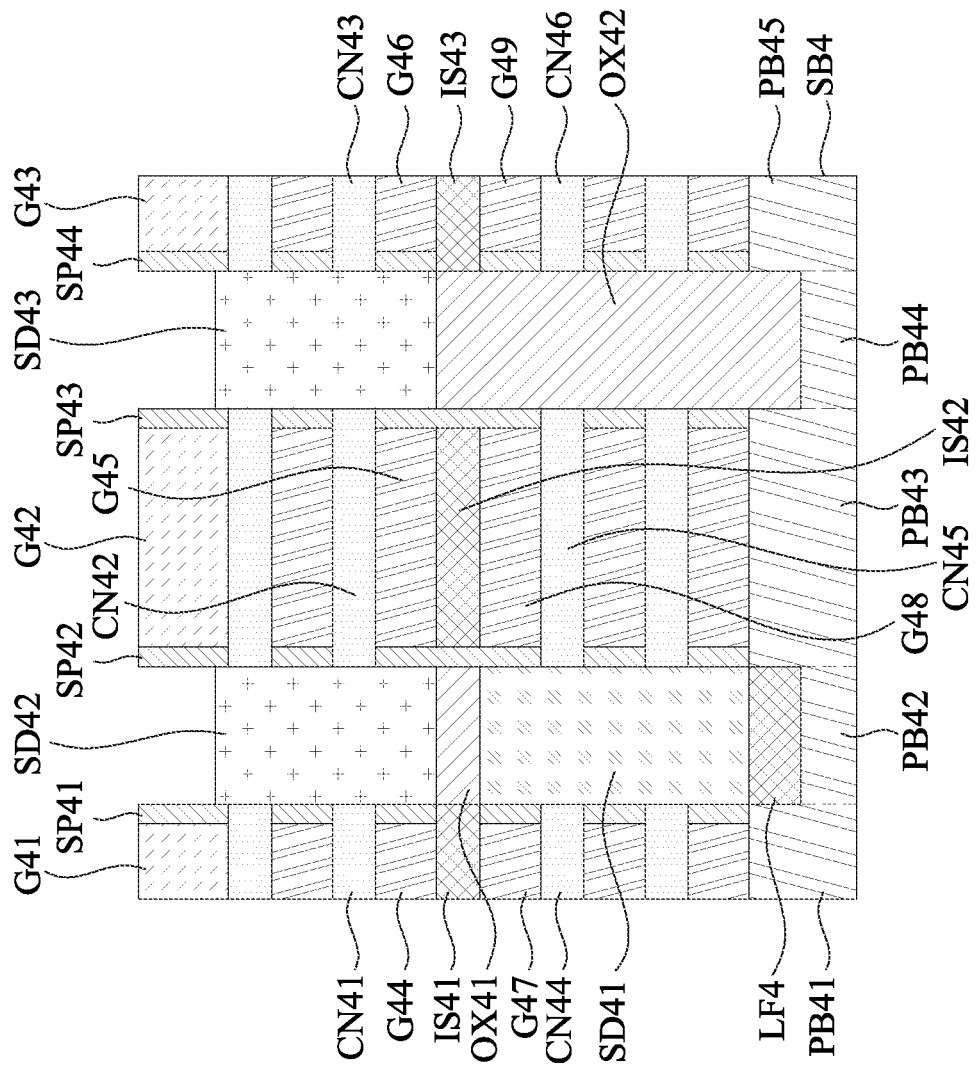

FIG. 4I is a cross section diagram of the semiconductor device 400 corresponding to the method 300 shown in FIG. 3, in accordance with some embodiments of the present disclosure. The Y direction points into the paper in FIG. 4I.

Referring to FIG. 4I and FIG. 3, the cross section diagram shown in FIG. 4I corresponds to an intermediate state of the semiconductor device 400 during a manufacturing process of the method 300.

As illustratively shown in FIG. 4I, the semiconductor device 400 further includes source/drain structures SD42 and SD43. Referring to FIG. 4I and FIG. 3, the cross section diagram shown in FIG. 4I corresponds to the operation OP39. At the operation OP39, the source/drain structures SD42 and SD43 are formed. In some embodiments, the source/drain structures SD42 and SD43 are formed by an epitaxial growth process. In some embodiments, sizes of the source/drain structures SD42 and SD43 are the same.

As illustratively shown in FIG. 4I, the source/drain structure SD42 is formed on the insulation structure OX41 and is coupled to each of the channel structures CN41 and CN42. The source/drain structure SD43 is formed on the insulation structure OX42 and is coupled to each of the channel structures CN43 and CN42. Along the X direction, a width of the source/drain structure SD43 is approximately equal to the width of the insulation structure OX42. In some embodiments, the source/drain structures SD42, SD43 and the gate structure G45 are configured to operate as a transistor, and correspond to two source/drain terminal and a gate terminal of the transistor, respectively.

Referring to FIG. 1, FIG. 4E and FIG. 4I, the semiconductor device 400 is an embodiment of the semiconductor device 100. The gate structures G42, G45 and G48 correspond to the gate structure G11. The spacers SP42 and SP43 correspond to the surfaces S11 and S12, respectively. The source/drain structures SD41-SD43, the channel structures CN42, CN45, the insulation structure OX42 and the isolation layer IS41 correspond to the source/drain structures SD11-SD13, the channel structures CN11, CN12, the insulation structure OX11 and the isolation layer IS11, respectively. Therefore, some descriptions are not repeated for brevity.

Referring to FIG. 2A, FIG. 2B and FIG. 4I, the semiconductor device 400 is an embodiment of the semiconductor device 200. The source/drain structures SD41-SD43 and the insulation structures OX41, OX42 correspond to the source/drain structures SD21-SD23 and the insulation structures OX21, OX22, respectively. Therefore, some descriptions are not repeated for brevity.

Figure 5:
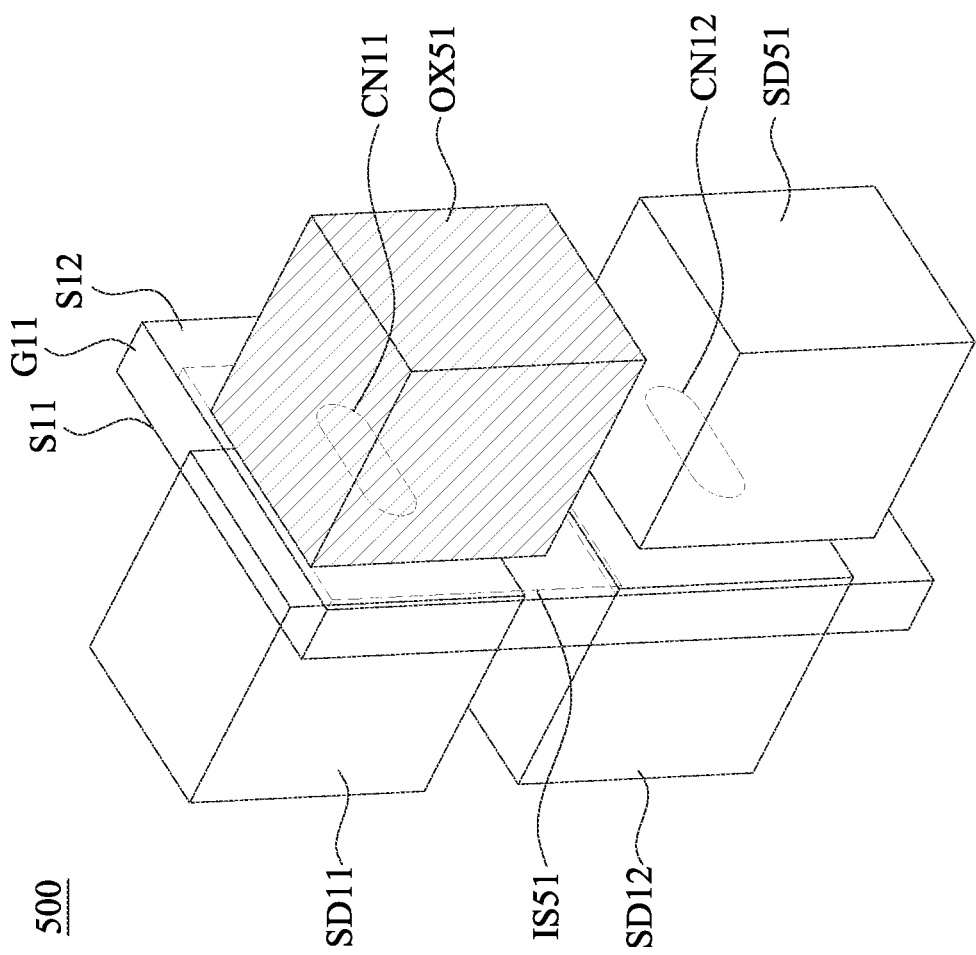
FIG. 5 is a three-dimensional schematic diagram of a semiconductor device corresponding to the semiconductor device shown in FIG. 1, in accordance with some embodiments of the present disclosure.

FIG. 5 is a three-dimensional schematic diagram of a semiconductor device 500 corresponding to the semiconductor device 100 shown in FIG. 1, in accordance with some embodiments of the present disclosure. Referring to FIG. 1 and FIG. 5, the semiconductor device 500 is an alternative embodiment of the semiconductor device 100. FIG. 5 follows a similar labeling convention to that of FIG. 1. For brevity, the discussion will focus more on differences between FIG. 1 and FIG. 5 than on similarities.

Compared to the semiconductor device 100, the semiconductor device 500 includes a source/drain structure SD51 and an insulation structure OX51 instead of the source/drain structure SD13 and the insulation structure OX11. Instead of the isolation layer IS11, the semiconductor device 500 includes an isolation layer IS51 during a manufacturing process of the semiconductor device 500. In some embodiments, the isolation layer IS51 is removed after the manufacturing process.

As illustratively shown in FIG. 5, each of the source/drain structure SD51 and the insulation structure OX51 is formed at the surface S12. The source/drain structure SD13 and the insulation structure OX11 are arranged in order along the Z direction. Along the X direction, the gate structure G11 is sandwiched between the source/drain structures SD12 and SD51, and is sandwiched between the insulation structure OX51 and the source/drain structure SD11.

In some embodiments, the channel structure CN12 is coupled to the source/drain structures SD12 and SD51 at the surfaces S11 and S12, respectively. In some embodiments, the gate structure G11 and the source/drain structures SD12, SD51 are configured to operate as a transistor, and correspond to a control terminal and two source/drain terminals of the transistor, respectively. The channel structure CN11 is coupled to the source/drain structure SD11 at the surface S11. In some embodiments, the channel structure CN11 contacts with the insulation structure OX51.

In some embodiments, the source/drain structures SD51 is formed by an epitaxial growth process, and is referred to as an epitaxial structure. In some embodiments, the source/drain structure SD11 has the first conductive type, and the source/drain structures SD12 and SD51 have the second conductive type different from the first conductive type. For example, each of the source/drain structures SD12 and SD51 is formed by P-type doped material, and the source/drain structure SD11 is formed by N-type doped material.

In some embodiments, during the manufacturing process, the isolation layer IS51 is formed at the surface S12. In some embodiments, the source/drain structure SD51 is formed from the channel CN12 by an epitaxial growth process, and grows along the X direction. During the epitaxial growth process, the isolation layer IS51 isolates the channel CN11 to avoid a source/drain structure forming from the channel CN11 at the surface S12. After the epitaxial growth process, the isolation layer IS51 is removed and the insulation structure OX51 is formed at a position of the isolation layer IS51.

As illustratively shown in FIG. 1, the insulation structure OX51 is formed to fill the space above the source/drain structure SD51 and opposite to the source/drain structure SD11. The insulation structure OX51 has a size equal to or larger than the source/drain structure SD11. For example, along the Y-Z plane, an area of the insulation structure OX51 is equal to or larger than an area of the source/drain structure SD11. In some embodiments, the insulation structure OX51 does not be capacitive coupled to other elements of the semiconductor device 500.

In some approaches, source/drain structures form from the channels during an epitaxial growth process. Some of the source/drain structures are referred to as dummy devices and are not functional. The source/drain structures of the dummy devices are capacitive coupled to surrounding elements, such as gate structures and metals, such that undesired extra cell capacitors are induced.

Compared to the above approaches, in some embodiments of the present disclosure, the isolation layer IS51 isolates the channel CN11 to avoid formation of source/drain structures of the dummy devices. Instead of the source/drain structures of the dummy devices, the insulation structure OX51 is formed. The insulation structure OX51 does not being capacitive coupled to surrounding elements. As a result, undesired cell capacitors of the semiconductor device 500 are reduced.

Figure 6A:
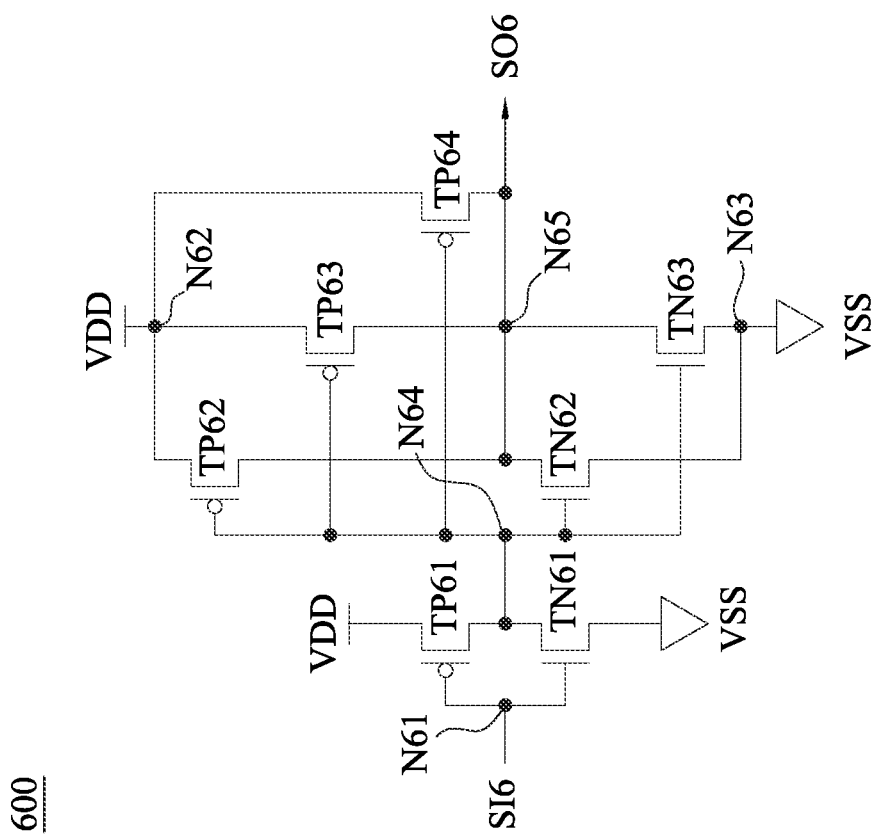
FIG. 6A is a circuit diagram of a semiconductor device corresponding to the semiconductor device shown in FIG. 1, in accordance with some embodiments of the present disclosure.

FIG. 6A is a circuit diagram of a semiconductor device 600 corresponding to the semiconductor device 100 shown in FIG. 1, in accordance with some embodiments of the present disclosure. In some embodiments, the semiconductor device 600 is configured to operate as a buffer. As illustratively shown in FIG. 6A, the semiconductor device 600 includes transistors TP61-TP64 and TN61-TN63. In some embodiments, the transistors TP61-TP64 are implemented by P-type transistors, and the transistors TN61-TN63 are implemented by N-type transistors.

As illustratively shown in FIG. 6A, each of control terminals of the transistors TP61 and TN61 is configured to receive an input signal SI6 at a node N61. Each of first terminals of the transistors TP61-TP64 is configured to receive a reference voltage signal VDD at a node N62. Each of first terminals of the transistors TN61-TN63 is configured to receive a reference voltage signal VSS at a node N63. Each of second terminals of the transistors TP61 and TN61 is coupled to a node N64. Each of control terminals of the transistors TP62-TP64 and TN62-TN63 is coupled to the node N64. Each of second terminals of the transistors TP62-TP64 and TN62-TN63 is configured to output an output signal S06 at a node N65.

Figure 6B:
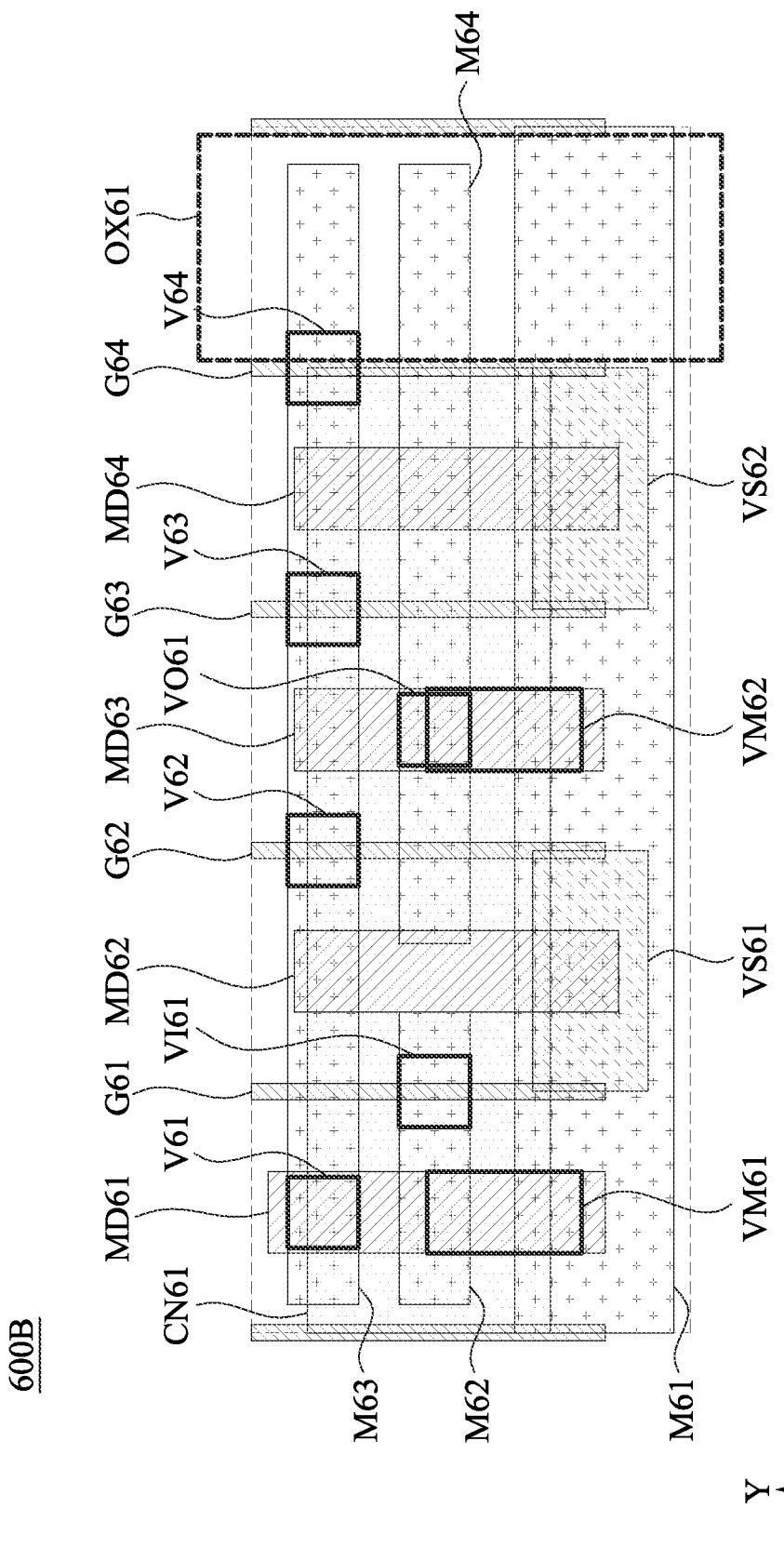
FIG. 6B is a layout diagram of a part of a semiconductor device corresponding to the semiconductor device shown in FIG. 6A, in accordance with some embodiments of the present disclosure.

FIG. 6B is a layout diagram of a part of a semiconductor device 600B corresponding to the semiconductor device 600 shown in FIG. 6A, in accordance with some embodiments of the present disclosure. The Z direction points out from the paper in FIG. 6B.

As illustratively shown in FIG. 6B, the semiconductor device 600B includes gate structures G61-G64, conductive segments MD61-MD64, M61-M64, an insulation structure OX61, a channel structure CN61 and vias V61-V64, VM61, VM62, VS61, VS62, VI61, VO61. Each of the gate structures G61-G64 and the conductive segments MD61-MD64 extends along the Y direction, and each of the channel structure CN61 and the conductive segments M61-M64 extends along the X direction. The conductive segment MD61, the gate structure G61, the conductive segment MD62, the gate structure G62, the conductive segment MD63, the gate structure G63 and the conductive segment MD64 are arranged in order along the X direction, and are overlapped with the channel structure CN61.

As illustratively shown in FIG. 6B, the channel structure CN61, the gate structure G64 and the insulation structure OX61 are arranged in order along the X direction. In some embodiments, the channel structure CN61 is formed through the gate structure G64 and contacts with the insulation structure OX61. Along the Y direction, a width of the insulation structure OX61 is larger than a width of the channel structure CN61. Along the X direction, a width of the insulation structure OX61 is equal to or larger than a gate pitch. The gate pitch is referred to as a distance between two adjacent gate structures, such as the gate structures G63 and G64.

As illustratively shown in FIG. 6B, the conductive segment MD61 is coupled to the conductive segment M63 through the via V61, and is coupled to the via VM61. The gate structure G61 is coupled to the conductive segment M62 through the via VI61. The conductive segments MD62 and MD64 are coupled to the conductive segment M61 through the vias VS61 and VS62, respectively. The gate structures G62-G64 are coupled to the conductive segment M63 through the vias V62-V64, respectively. The conductive segment MD63 is coupled to the conductive segment M64 through the via VO61, and is coupled to the via VM62.

In some embodiments, the conductive segments MD61-MD64 are coupled to corresponding source/drain structures (not shown in FIG. 6B). The source/drain structures coupled to the conductive segments MD61-MD64 and the gate structures G61-G63 are configured to operate as transistors. The gate structures G61-G63 correspond to gate terminals of the transistors, and the conductive segments MD61-MD64 correspond to source/drain terminals of the transistors. The channel structure CN61 corresponds to channels of the transistors.

Referring to FIG. 6B and FIG. 6A, in some embodiments, the transistors TN61-TN63 are implemented by the gate structures G61-G63, the source/drain structures coupled to the conductive segments MD61-MD64 and the channel structure CN61. The transistor TN61 corresponds to the gate structure G61 and the conductive segments MD61, MD62. The transistor TN62 corresponds to the gate structure G62 and the conductive segments MD62, MD63. The transistor TN63 corresponds to the gate structure G63 and the conductive segments MD63, MD64.

In such embodiments, the conductive segment M62 is configured to transmit the input signal SI6 to the gate structure G61. The conductive segment M64 is configured to output the output signal S06. The conductive segment M61 is configured to transmit the reference voltage signal VSS to the conductive segments MD62 and MD64. The conductive segments M61-M64 corresponds to the nodes N63, N61, N64 and N65, respectively.

Figure 6C:
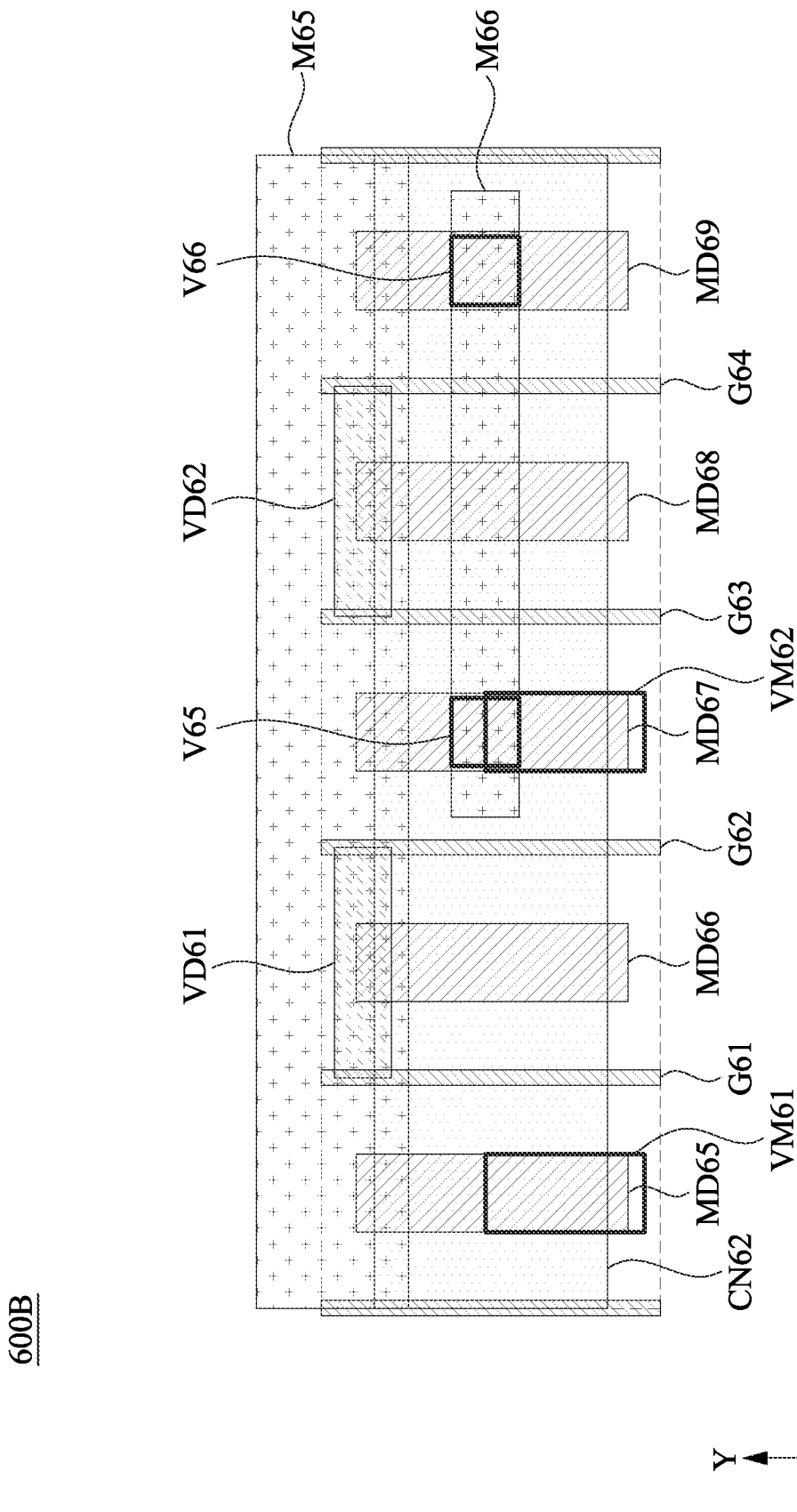
FIG. 6C is a layout diagram of another part of a semiconductor device corresponding to the semiconductor device shown in FIG. 6A, in accordance with some embodiments of the present disclosure.

FIG. 6C is a layout diagram of another part of a semiconductor device 600B corresponding to the semiconductor device 600 shown in FIG. 6A, in accordance with some embodiments of the present disclosure. The Z direction points out from the paper in FIG. 6C. Referring to FIG. 6B and FIG. 6C, the part shown in FIG. 6B is formed above the part shown in FIG. 6C along the Z direction. The gate structures G61-G64 and the vias VM61 and VM62 extend along the Z direction, and are shown in each of FIG. 6B and FIG. 6C.

As illustratively shown in FIG. 6C, the semiconductor device 600B further includes conductive segments MD65-MD69, M65-M66, a channel structure CN62 and vias V65-V66, VD61, VD62. Each of the conductive segments MD65-MD69 extends along the Y direction, and each of the channel structure CN62 and the conductive segments M64-M65 extends along the X direction. The conductive segment MD65, the gate structure G61, the conductive segment MD66, the gate structure G62, the conductive segment MD67, the gate structure G63, the conductive segment MD68, the gate structure G64 and the conductive segment MD69 are arranged in order along the X direction, and are overlapped with the channel structure CN62.

As illustratively shown in FIG. 6C, the conductive segments MD65 and MD67 are coupled to the vias VM61 and VM62, respectively. The conductive segments MD67 and MD69 are coupled to the conductive segment M66 through the vias V65 and V66, respectively. The conductive segments MD66 and MD68 are coupled to the conductive segment M65 through the vias VD61 and VD62, respectively.

Referring to FIG. 6B and FIG. 6C, the conductive segment MD65 is coupled to the conductive segment MD61 through the via VM61. The conductive segment MD67 is coupled to the conductive segment MD63 through the via VM62. The insulation structure OX61 is overlapped with the conductive segment MD69 along the Z direction. Along the X direction, a width of the channel structure CN62 is approximately equal to a width of the channel structure CN61 plus the width of the insulation structure OX61.

In some embodiments, the conductive segments MD65-MD69 are coupled to corresponding source/drain structures (not shown in FIG. 6C). The source/drain structures coupled to the conductive segments MD65-MD69 and the gate structures G61-G64 are configured to operate as transistors. The gate structures G61-G64 correspond to gate terminals of the transistors, and the conductive segments MD65-MD69 correspond to source/drain terminals of the transistors. The channel structure CN62 corresponds to channels of the transistors.

Referring to FIG. 6C and FIG. 6A, in some embodiments, the transistors TP61-TP64 are implemented by the gate structures G61-G64, the source/drain structures coupled to the conductive segments MD65-MD69 and the channel structure CN62. The transistor TP61 corresponds to the gate structure G61 and the conductive segments MD65, MD66. The transistor TP62 corresponds to the gate structure G62 and the conductive segments MD66, MD67. The transistor TP63 corresponds to the gate structure G63 and the conductive segments MD67, MD68. The transistor TP64 corresponds to the gate structure G64 and the conductive segments MD68, MD69.

In such embodiments, the conductive segment M66 is configured to couple the transistors TP62-TP64 in parallel. The conductive segment M65 is configured to transmit the reference voltage signal VDD to the conductive segments MD66 and MD68, and corresponds to the node N62.

Referring to FIG. 6C, FIG. 6B and FIG. 5, the semiconductor device 600B is an embodiment of the semiconductor device 500. The gate structure G64, the conductive segments MD64, MD68, MD69, the channel structures CN61, CN62 and the insulation structure OX61 correspond to the gate structure G11, the source/drain structures SD11, SD12, SD51, the channel structures CN11, CN12 and the insulation structure OX51, respectively. For example, the conductive segments MD64, MD68 and MD69 are coupled to the source/drain structures SD11, SD12 and SD51, respectively. Therefore, some descriptions are not repeated for brevity.

Figure 7A:
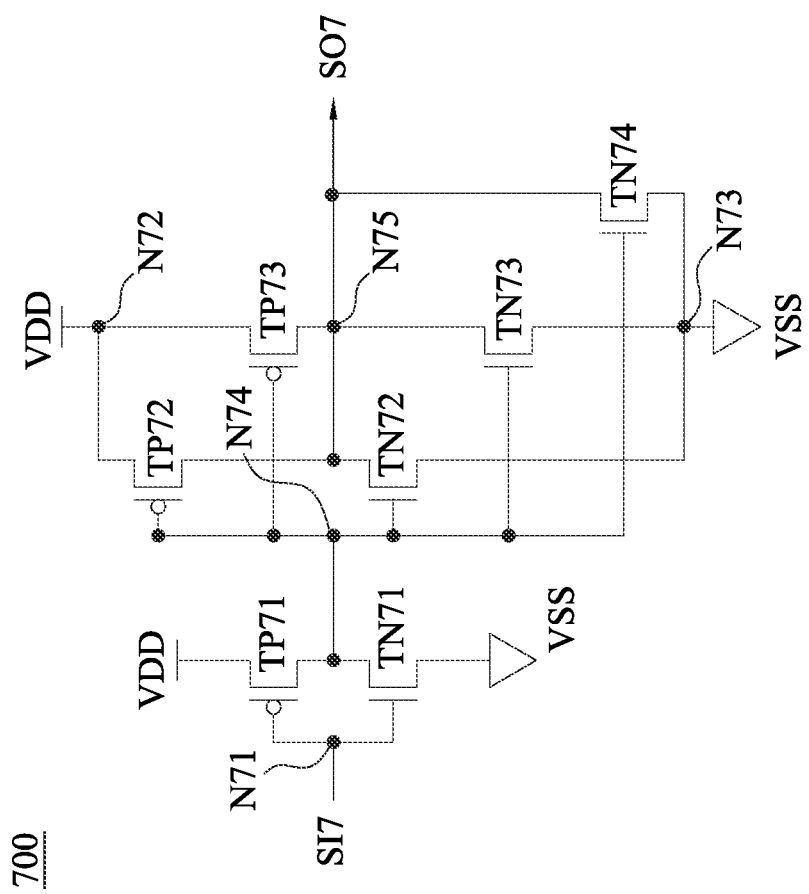
FIG. 7A is a circuit diagram of a semiconductor device corresponding to the semiconductor device shown in FIG. 1, in accordance with some embodiments of the present disclosure.

FIG. 7A is a circuit diagram of a semiconductor device 700 corresponding to the semiconductor device 100 shown in FIG. 1, in accordance with some embodiments of the present disclosure. In some embodiments, the semiconductor device 700 is configured to operate as a buffer. As illustratively shown in FIG. 7A, the semiconductor device 700 includes transistors TP71-TP73 and TN71-TN74. In some embodiments, the transistors TP71-TP73 are implemented by P-type transistors, and the transistors TN71-TN74 are implemented by N-type transistors.

As illustratively shown in FIG. 7A, each of control terminals of the transistors TP71 and TN71 is configured to receive an input signal SI7 at a node N71. Each of first terminals of the transistors TP71-TP73 is configured to receive a reference voltage signal VDD at a node N72. Each of first terminals of the transistors TN71-TN74 is configured to receive a reference voltage signal VSS at a node N73. Each of second terminals of the transistors TP71 and TN71 is coupled to a node N74. Each of control terminals of the transistors TP72-TP73 and TN72-TN74 is coupled to the node N74. Each of second terminals of the transistors TP72-TP73 and TN72-TN74 is configured to output an output signal SO7 at a node N75.

Figure 7B:
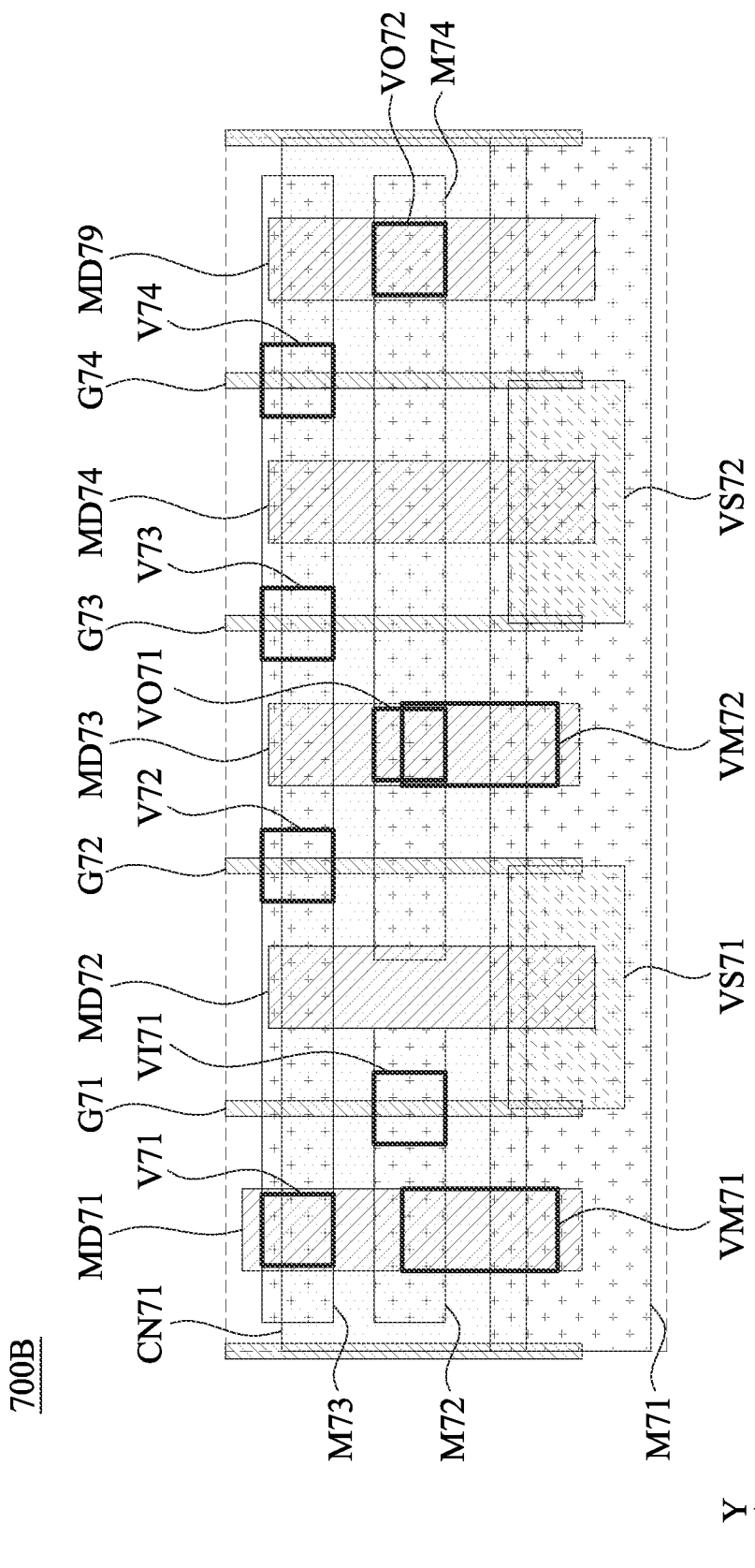
FIG. 7B is a layout diagram of a part of a semiconductor device corresponding to the semiconductor device shown in FIG. 7A, in accordance with some embodiments of the present disclosure.

FIG. 7B is a layout diagram of a part of a semiconductor device 700B corresponding to the semiconductor device 700 shown in FIG. 7A, in accordance with some embodiments of the present disclosure. The Z direction points out from the paper in FIG. 7B.

As illustratively shown in FIG. 7B, the semiconductor device 700B includes gate structures G71-G74, conductive segments MD71-MD74, MD79, M71-M74, a channel structure CN71 and vias V71-V74, VM71, VM72, VS71, VS72, VI71, VO71, VO72. Each of the gate structures G71-G74 and the conductive segments MD71-MD74, MD79 extends along the Y direction, and each of the channel structure CN71 and the conductive segments M71-M74 extends along the X direction. The conductive segment MD71, the gate structure G71, the conductive segment MD72, the gate structure G72, the conductive segment MD73, the gate structure G73, the conductive segment MD74, the gate structure G74, the conductive segment MD79 are arranged in order along the X direction, and are overlapped with the channel structure CN71.

As illustratively shown in FIG. 7B, the conductive segment MD71 is coupled to the conductive segment M73 through the via V71, and is coupled to the via VM71. The gate structure G71 is coupled to the conductive segment M72 through the via VI71. The conductive segments MD72 and MD74 are coupled to the conductive segment M71 through the vias VS71 and VS72, respectively. The gate structures G72-G74 are coupled to the conductive segment M73 through the vias V72-V74, respectively. The conductive segment MD73 is coupled to the conductive segment M74 through the via VO71, and is coupled to the via VM72. The conductive segment MD75 is coupled to the conductive segment M74 through the via VO72.

In some embodiments, the conductive segments MD71-MD74 are coupled to corresponding source/drain structures (not shown in FIG. 7B). The source/drain structures coupled to the conductive segments MD71-MD74 and the gate structures G71-G73 are configured to operate as transistors. The gate structures G71-G73 correspond to gate terminals of the transistors, and the conductive segments MD71-MD74 correspond to source/drain terminals of the transistors. The channel structure CN71 corresponds to channels of the transistors.

Referring to FIG. 7B and FIG. 7A, in some embodiments, the transistors TN71-TN74 are implemented by the gate structures G71-G74, the source/drain structures coupled to the conductive segments MD71-MD75 and the channel structure CN71. The transistor TN71 corresponds to the gate structure G71 and the conductive segments MD71, MD72. The transistor TN72 corresponds to the gate structure G72 and the conductive segments MD72, MD73. The transistor TN73 corresponds to the gate structure G73 and the conductive segments MD73, MD74. The transistor TN74 corresponds to the gate structure G74 and the conductive segments MD74, MD79.

In such embodiments, the conductive segment M72 is configured to transmit the input signal SI7 to the gate structure G71. The conductive segment M74 is configured to output the output signal SO7 from the conductive segments MD73 and MD79. The conductive segment M71 is configured to transmit the reference voltage signal VSS to the conductive segments MD72 and MD74. The conductive segments M71-M74 corresponds to the nodes N73, N71, N74 and N75, respectively.

Figure 7C:
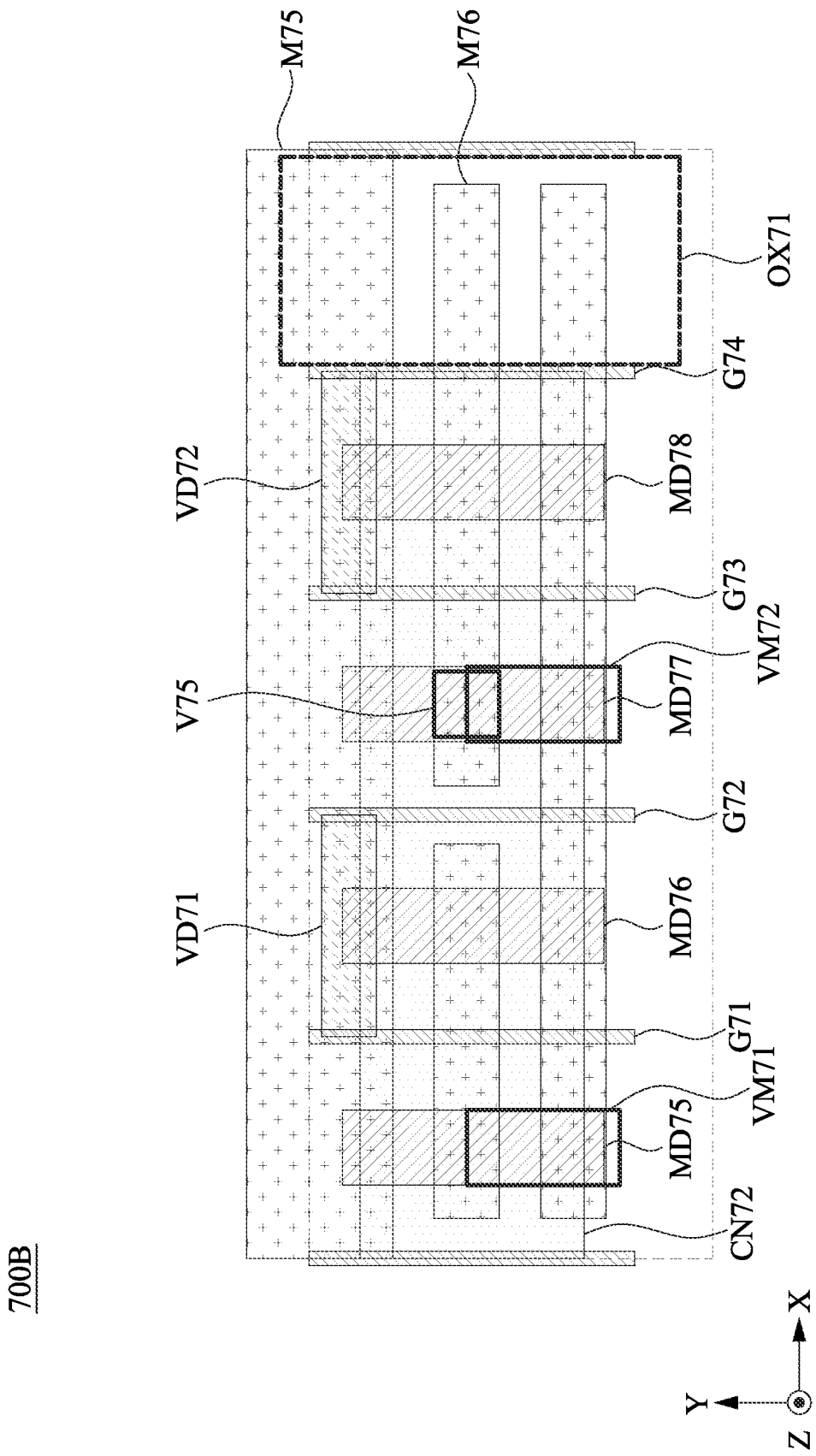
FIG. 7C is a layout diagram of another part of a semiconductor device corresponding to the semiconductor device shown in FIG. 7A, in accordance with some embodiments of the present disclosure.

FIG. 7C is a layout diagram of another part of a semiconductor device 700B corresponding to the semiconductor device 700 shown in FIG. 7A, in accordance with some embodiments of the present disclosure. The Z direction points out from the paper in FIG. 7C. Referring to FIG. 7B and FIG. 7C, the part shown in FIG. 7B is formed above the part shown in FIG. 7C along the Z direction. The gate structures G71-G74 and the vias VM71 and VM72 extend along the Z direction, and are shown in each of FIG. 7B and FIG. 7C.

As illustratively shown in FIG. 7C, the semiconductor device 700B further includes conductive segments MD75-MD78, M75-M76, a channel structure CN72, an insulation structure OX71 and vias V75, VD71, VD72. Each of the conductive segments MD75-MD78 extends along the Y direction, and each of the channel structure CN72 and the conductive segments M75-M76 extends along the X direction. The conductive segment MD75, the gate structure G71, the conductive segment MD76, the gate structure G72, the conductive segment MD77, the gate structure G73, the conductive segment MD78 and the gate structure G74 are arranged in order along the X direction, and are overlapped with the channel structure CN72.

As illustratively shown in FIG. 7C, the channel structure CN72, the gate structure G74 and the insulation structure OX71 are arranged in order along the X direction. In some embodiments, the channel structure CN72 is formed through the gate structure G74 and contacts with the insulation structure OX71. Along the Y direction, a width of the insulation structure OX71 is larger than a width of the channel structure CN72. Along the X direction, a width of the insulation structure OX71 is equal to or larger than the gate pitch. The gate pitch is referred to as a distance between two adjacent gate structures, such as the gate structures G73 and G74.

As illustratively shown in FIG. 7C, the conductive segments MD75 and MD77 are coupled to the vias VM71 and VM72, respectively. The conductive segments MD77 is coupled to conductive segment M76 through the via V75. The conductive segments MD76 and MD78 are coupled to conductive segment M75 through the vias VD71 and VD72, respectively.

Referring to FIG. 7B and FIG. 7C, the conductive segment MD75 is coupled to the conductive segment MD71 through the via VM71. The conductive segment MD77 is coupled to the conductive segment MD73 through the via VM72. The insulation structure OX71 is overlapped with the conductive segment MD79 along the Z direction. Along the X direction, a width of the channel structure CN71 is approximately equal to a width of the channel structure CN72 plus the width of the insulation structure OX71.

In some embodiments, the conductive segments MD75-MD78 are coupled to corresponding source/drain structures (not shown in FIG. 7C). The source/drain structures coupled to the conductive segments MD75-MD78 and the gate structures G71-G73 are configured to operate as transistors. The gate structures G71-G73 correspond to gate terminals of the transistors, and the conductive segments MD75-MD78 correspond to source/drain terminals of the transistors. The channel structure CN72 corresponds to channels of the transistors.

Referring to FIG. 7C and FIG. 7A, in some embodiments, the transistors TP71-TP73 are implemented by the gate structures G71-G73, the source/drain structures coupled to the conductive segments MD75-MD78 and the channel structure CN72. The transistor TP71 corresponds to the gate structure G71 and the conductive segments MD75, MD76. The transistor TP72 corresponds to the gate structure G72 and the conductive segments MD76, MD77. The transistor TP73 corresponds to the gate structure G73 and the conductive segments MD77, MD78. In such embodiments, the conductive segment M75 is configured to transmit the reference voltage signal VDD to the conductive segments MD77 and MD78, and corresponds to the node N72.

Referring to FIG. 7C, FIG. 7B and FIG. 1, the semiconductor device 700B is an embodiment of the semiconductor device 100. The gate structure G74, the conductive segments MD74, MD79, MD78, the channel structures CN71, CN72 and the insulation structure OX71 correspond to the gate structure G11, the source/drain structures SD11, SD13, SD12, the channel structures CN11, CN12 and the insulation structure OX11, respectively. For example, the conductive segments MD74, MD79 and MD78 are coupled to the source/drain structures SD11, SD13 and SD12, respectively. Therefore, some descriptions are not repeated for brevity.

Referring to FIG. 7C, FIG. 7B, FIG. 2A and FIG. 2B, the semiconductor device 700B is an embodiment of the semiconductor device 200. The conductive segments MD74, MD79, MD78 and the insulation structure OX71 correspond to the conductive segments MD21, MD23, MD22 and the insulation structure OX22, respectively. For example, the conductive segments MD74, MD79 and MD78 are coupled to the source/drain structures SD21, SD23 and SD22, respectively. Therefore, some descriptions are not repeated for brevity.

Referring to FIG. 7C, FIG. 7B and FIG. 4I, the semiconductor device 700B is an embodiment of the semiconductor device 400. The gate structure G74 corresponds to the gate structures G42, G45 and G48. The gate structure G73 corresponds to the gate structures G41, G44 and G47. The channel structure CN71 corresponds to the channel structures CN41 and CN42. The channel structure CN72 corresponds to the channel structures CN44 and CN45. The conductive segments MD74, MD79, MD78 and the insulation structure OX71 correspond to the source/drain structures SD42, SD43, SD41 and the insulation structure OX42, respectively.

For example, the conductive segments MD74, MD79 and MD78 are coupled to the source/drain structures SD42, SD43 and SD41, respectively. The transistor TN74 shown in FIG. 7A is implemented by the source/drain structures SD42, SD43 and the gate structure G45. The source/drain structure SD41 corresponds to the node N72 and is configured to receive the reference voltage signal VDD. Therefore, some descriptions are not repeated for brevity.

Figure 8A:
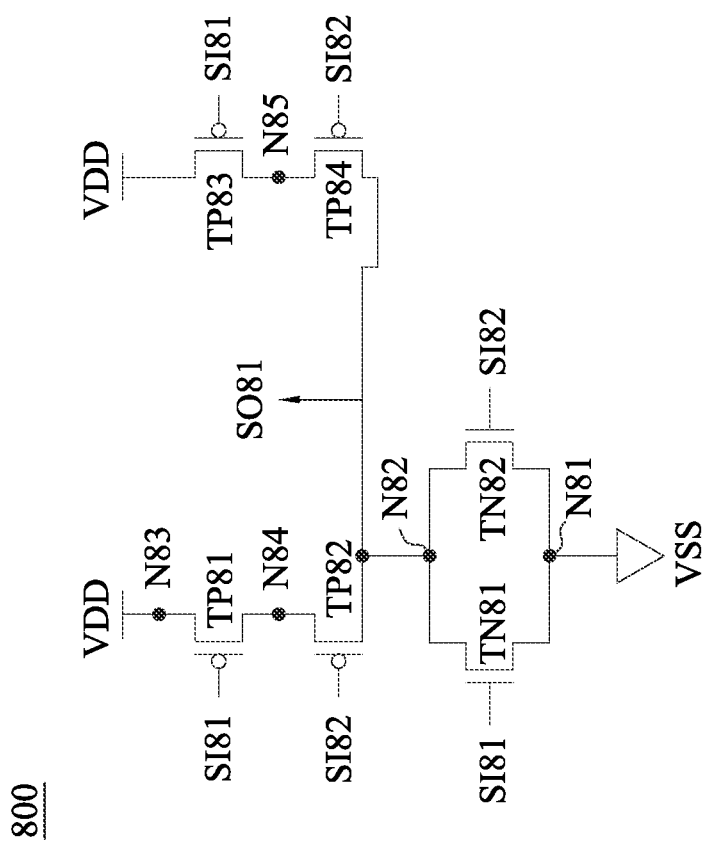
FIG. 8A is a circuit diagram of a semiconductor device corresponding to the semiconductor device shown in FIG. 1, in accordance with some embodiments of the present disclosure.

FIG. 8A is a circuit diagram of a semiconductor device 800 corresponding to the semiconductor device 100 shown in FIG. 1, in accordance with some embodiments of the present disclosure. In some embodiments, the semiconductor device 800 is configured to operate as a NOR logic gate. As illustratively shown in FIG. 8A, the semiconductor device 800 includes transistors TP81-TP84 and TN81-TN82. In some embodiments, the transistors TP81-TP84 are implemented by P-type transistors, and the transistors TN81-TN82 are implemented by N-type transistors.

As illustratively shown in FIG. 8A, each of control terminals of the transistors TP81, TP83 and TN81 is configured to receive an input signal SI81. Each of control terminals of the transistors TP82, TP84 and TN82 is configured to receive another input signal SI82. Each of first terminals of the transistors TN81 and TN82 is configured to receive the reference voltage signal VSS at a node N81. Each of first terminals of the transistors TP81 and TP83 is configured to receive the reference voltage signal VDD at a node N83. A second terminal of the transistor TP81 is coupled to a first terminal of the transistor TP82 at a node N84. A second terminal of the transistor TP83 is coupled to a first terminal of the transistor TP84 at a node N84. Second terminals of the transistors TN81, TN82, TP82 and TP84 are coupled to each other at a node N82, and are configured to output an output signal SO81.

Figure 8B:
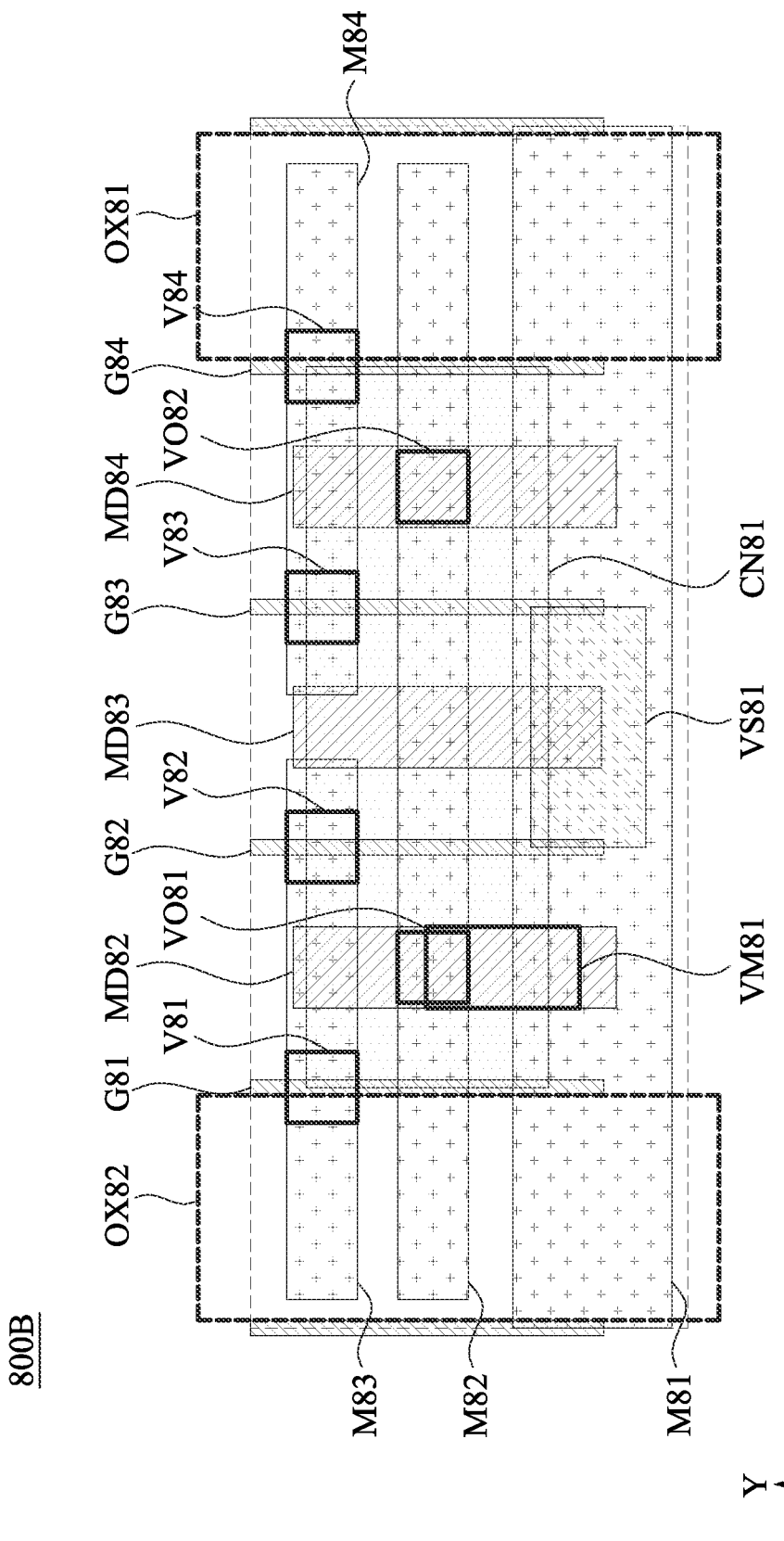
FIG. 8B is a layout diagram of a part of a semiconductor device corresponding to the semiconductor device shown in FIG. 8A, in accordance with some embodiments of the present disclosure.

FIG. 8B is a layout diagram of a part of a semiconductor device 800B corresponding to the semiconductor device 800 shown in FIG. 8A, in accordance with some embodiments of the present disclosure. The Z direction points out from the paper in FIG. 8B.

As illustratively shown in FIG. 8B, the semiconductor device 800B includes gate structures G81-G84, conductive segments MD82-MD84, M81-M84, insulation structures OX81, OX82, a channel structure CN81 and vias V81-V84, VM81, VO81, VO82, VS81. Each of the gate structures G81-G84 and the conductive segments MD82-MD84 extends along the Y direction, and each of the channel structure CN81 and the conductive segments M81-M84 extends along the X direction. The conductive segment MD82, the gate structure G82, the conductive segment MD83, the gate structure G83 and the conductive segment MD84 are arranged in order along the X direction, and are overlapped with the channel structure CN81.

As illustratively shown in FIG. 8B, the insulation structure OX82, the gate structure G81, the channel structure CN81, the gate structure G84 and the insulation structure OX81 are arranged in order along the X direction. In some embodiments, the channel structure CN81 is formed through each of the gate structures G81 and G84. In some embodiments, two terminals of the channel structure CN81 contact with the insulation structures OX82 and OX81, respectively.

As illustratively shown in FIG. 8B, along the X direction, each of widths of the insulation structures OX82 and OX81 is equal to or larger than the gate pitch. The gate pitch is referred to as a distance between two adjacent gate structures, such as the gate structures G83 and G84. In some embodiments, sizes of the insulation structures OX82 and OX81 are approximately the same. For example, along the X direction, each of widths of the insulation structures OX82 and OX81 is approximately equal to the gate pitch.

As illustratively shown in FIG. 8B, along the Y direction, each of the widths of the insulation structures OX82 and OX81 is larger than a width of the channel structure CN81. The channel structure CN81 is sandwiched between the insulation structures OX82 and OX81 along the X direction.

In some embodiments, a width of the channel structure CN81 along the X direction is approximately equal to three gate pitches.

As illustratively shown in FIG. 8B, the gate structures G81 and G82 are coupled to the conductive segment M83 through the vias V81 and V82, respectively. The conductive segment MD82 is coupled to the conductive segment M82 through the via VO81, and is coupled to the via VM81. The conductive segments MD83 is coupled to the conductive segment M81 through the via VS81. The gate structures G83 and G84 are coupled to the conductive segment M84 through the vias V83 and V84, respectively. The conductive segment MD84 is coupled to the conductive segment M82 through the via VO82.

In some embodiments, the conductive segments MD82-MD84 are coupled to corresponding source/drain structures (not shown in FIG. 8B). The source/drain structures coupled to the conductive segments MD82-MD84 and the gate structures G82-G83 are configured to operate as transistors. The gate structures G82-G83 correspond to gate terminals of the transistors, and the conductive segments MD82-MD84 correspond to source/drain terminals of the transistors. The channel structure CN81 corresponds to channels of the transistors.

Referring to FIG. 8B and FIG. 8A, in some embodiments, the transistors TN81-TN82 are implemented by the gate structures G82-G83, the source/drain structures coupled to the conductive segments MD82-MD84 and the channel structure CN81. The transistor TN81 corresponds to the gate structure G82 and the conductive segments MD82, MD83. The transistor TN82 corresponds to the gate structure G83 and the conductive segments MD84, MD83.

In such embodiments, the conductive segment M83 is configured to transmit the input signal SI81 to the gate structure G82. The conductive segment M84 is configured to transmit the input signal SI82 to the gate structure G83. The conductive segment M82 is configured to output the output signal SO81. The conductive segment M81 is configured to transmit the reference voltage signal VSS to the conductive segment MD83. The conductive segments M81 and M82 correspond to the nodes N81 and N82, respectively.

Figure 8C:
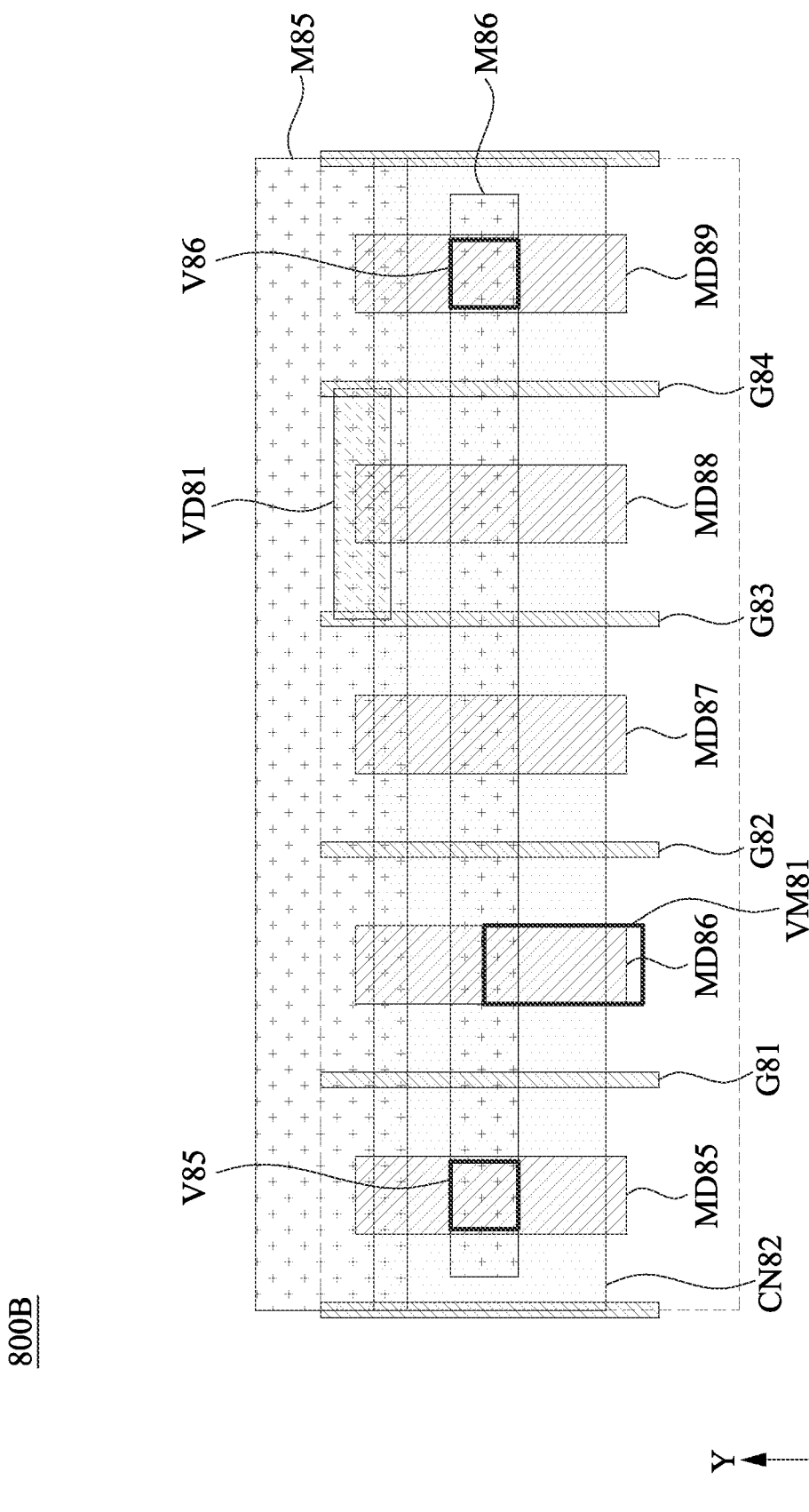
FIG. 8C is a layout diagram of another part of a semiconductor device corresponding to the semiconductor device shown in FIG. 8A, in accordance with some embodiments of the present disclosure.

FIG. 8C is a layout diagram of another part of a semiconductor device 800B corresponding to the semiconductor device 800 shown in FIG. 8A, in accordance with some embodiments of the present disclosure. The Z direction points out from the paper in FIG. 8C. Referring to FIG. 8B and FIG. 8C, the part shown in FIG. 8B is formed above the part shown in FIG. 8C along the Z direction. The gate structures G81-G84 and the via VM81 extend along the Z direction, and are shown in each of FIG. 8B and FIG. 8C.

As illustratively shown in FIG. 8C, the semiconductor device 800B further includes conductive segments MD85-MD89, M85-M86, a channel structure CN82 and vias V85-V86, VD81. Each of the conductive segments MD85-MD89 extends along the Y direction, and each of the channel structure CN82 and the conductive segments M85-M86 extends along the X direction. The conductive segment MD85, the gate structure G81, the conductive segment MD86, the gate structure G82, the conductive segment MD87, the gate structure G83, the conductive segment MD88, the gate structure G84 and the conductive segment MD89 are arranged in order along the X direction, and are overlapped with the channel structure CN82.

As illustratively shown in FIG. 8C, the conductive segments MD85 and MD89 are coupled to the conductive segment M86 through the vias V85 and V86, respectively. The conductive segment MD86 is coupled to the via VM81.

The conductive segment MD88 is coupled to the conductive segment M85 through the via VD81.

Referring to FIG. 8B and FIG. 8C, the conductive segment MD86 is coupled to the conductive segment MD82 through the via VM81. Along the Z direction, the insulation structure OX81 is overlapped with the conductive segment MD89, and the insulation structure OX82 is overlapped with the conductive segment MD85. Along the X direction, a width of the channel structure CN82 is approximately equal to a width of the channel structure CN81 plus the width of the insulation structure OX81 and the width of the insulation structure OX82.

In some embodiments, the conductive segments MD85-MD89 are coupled to corresponding source/drain structures (not shown in FIG. 8C). The source/drain structures coupled to the conductive segments MD85-MD89 and the gate structures G81-G84 are configured to operate as transistors. The gate structures G81-G84 correspond to gate terminals of the transistors, and the conductive segments MD85-MD89 correspond to source/drain terminals of the transistors. The channel structure CN82 corresponds to channels of the transistors.

Referring to FIG. 8C and FIG. 8A, in some embodiments, the transistors TP81-TP84 are implemented by the gate structures G81-G84, the source/drain structures coupled to the conductive segments MD85-MD89 and the channel structure CN82. The transistor TP81 corresponds to the gate structure G83 and the conductive segments MD87, MD88. The transistor TP83 corresponds to the gate structure G84 and the conductive segments MD88, MD89. The transistor TP82 corresponds to the gate structure G82 and the conductive segments MD86, MD87. The transistor TP84 corresponds to the gate structure G81 and the conductive segments MD85, MD86.

In such embodiments, the conductive segment M84 corresponds to the node N85. The conductive segment M85 is configured to transmit the reference voltage signal VDD to the conductive segment MD88, and corresponds to the node N83.

Referring to FIG. 8C, FIG. 8B and FIG. 5, the semiconductor device 800B is an embodiment of the semiconductor device 500. The gate structure G84, the conductive segments MD84, MD88, MD89, the channel structures CN81, CN82 and the insulation structure OX81 correspond to the gate structure G11, the source/drain structures SD11, SD12, SD51, the channel structures CN11, CN12 and the insulation structure OX51, respectively. For example, the conductive segments MD84, MD88 and MD89 are coupled to the source/drain structures SD11, SD12 and SD51, respectively. Therefore, some descriptions are not repeated for brevity.

Furthermore, features of the insulation structure OX82 is also similar with the insulation structure OX51. The gate structure G81, the conductive segments MD82, MD86, MD85, the channel structures CN81, CN82 and the insulation structure OX82 correspond to the gate structure G11, the source/drain structures SD11, SD12, SD51, the channel structures CN11, CN12 and the insulation structure OX51, respectively. In some embodiments, the conductive segments MD82, MD86 and MD85 are coupled to the source/drain structures SD11, SD12 and SD51, respectively. Therefore, some descriptions are not repeated for brevity.

In summary, instead of source/drain structures, the insulation structure OX11, OX22, OX42, OX51, OX61, OX71, OX81 and OX82 are formed, and do not have capacitive coupling with surrounding elements. As a result, undesired cell capacitors of the semiconductor devices 100, 200, 400, 500, 600B, 700B and 800B are reduced.

Also disclosed is a method. The method includes: forming a first channel structure through a first gate structure; forming a first source/drain structure coupled to the first channel structure at a first surface of the first gate structure; before the first source/drain structure is formed, forming a first isolation layer at a second surface of the first gate structure to isolate the first channel structure; and after the first source/drain structure is formed, forming a first insulation structure at a position of the first isolation layer. The first surface and the second surface are opposite to each other, and a size of the first insulation structure is equal to or larger than a size of the first source/drain structure.

Also disclosed is a semiconductor device. The semiconductor device includes a first gate structure, a first channel structure, a first source/drain structure, a second source/drain structure, a second channel structure, a third source/drain structure and a first insulation structure. The first channel structure is surrounded by the first gate structure. The first source/drain structure is coupled to the first channel structure at a first surface of the first gate structure. The second source/drain structure is coupled to the first channel structure at a second surface of the first gate structure, and is configured to operate as a first transistor with the first gate structure and the first source/drain structure. The second channel structure is surrounded by the first gate structure. The third source/drain structure is coupled to the first channel structure at the first surface. The first insulation structure is formed at the second surface and has a size equal to or larger than a size of the third source/drain structure.

Also disclosed is a method. The method includes: forming a substrate, a first gate structure and a second gate structure arranged in order along a first direction; forming a first channel structure and a second channel structure which are coupled to the first gate structure and the second gate structure, respectively; forming an isolation layer at a first boundary of the first channel structure, to isolate the first boundary during an epitaxial growth process; and forming a first source/drain structure from a second boundary of the first channel structure by the epitaxial growth process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first channel structure through a first gate structure;
    forming a first source/drain structure coupled to the first channel structure at a first surface of the first gate structure;
    before the first source/drain structure is formed, forming a first isolation layer at a second surface of the first gate structure to isolate the first channel structure; and
    after the first source/drain structure is formed, forming a first insulation structure at a position of the first isolation layer,
    wherein the first surface and the second surface are opposite to each other, and a size of the first insulation structure is equal to or larger than a size of the first source/drain structure.

2. The method of claim 1, further comprising:
forming the first source/drain structure from a first boundary of the first channel structure by an epitaxial growth process; and
after the epitaxial growth process, removing the first isolation layer,
wherein the first isolation layer is configured to isolate a second boundary of the first channel structure during the epitaxial growth process,
the first insulation structure is formed after the first isolation layer is removed.

3. The method of claim 1, further comprising:
when the first insulation structure is formed, forming a second insulation structure on the first source/drain structure,
wherein a height of the first insulation structure is larger than a height of the second insulation structure plus a height of the first source/drain structure.

4. The method of claim 3, wherein in a cross sectional view, an area of the first insulation structure is larger than an area of the second insulation structure plus an area of the first source/drain structure.

5. The method of claim 1, wherein forming the first isolation layer comprises:
forming a first isolation portion at the second surface to isolate the first channel structure; and
forming a second isolation portion to isolate a second channel structure,
wherein the first channel structure, the first isolation portion, the second isolation portion and the second channel structure are arranged in order along a directionX direction, and
the first source/drain structure, the first gate structure and the first insulation structure are arranged in order along the direction.

6. The method of claim 5, wherein forming the first isolation layer further comprises:
forming a third isolation portion extending along the direction,
wherein two terminals of the third isolation portion is connected to the first isolation portion and the second isolation portion, respectively.

7. The method of claim 1, further comprising:
forming a second channel structure through the first gate structure,
wherein the second channel structure is configured to operate as a channel of a transistor,
the first gate structure is configured to operate as a gate terminal of the transistor,
along a directionX direction, a width of the second channel structure is larger than or equal to a width of the first channel structure plus a width of the first insulation structure, and
the first channel structure, the first gate structure and the first insulation structure are arranged in order along the direction.

8. The method of claim 7, further comprising:
forming a second insulation structure overlapped with the second channel structure,
wherein the first channel structure is sandwiched between the second insulation structure and the first insulation structure along the direction, and
the width of the second channel structure is approximately equal to the width of the first channel structure plus the width of the first insulation structure and a width of the second insulation structure.

9. A semiconductor device, comprising:
a first gate structure;
a first channel structure surrounded by the first gate structure;
a first source/drain structure coupled to the first channel structure at a first surface of the first gate structure;
a second source/drain structure coupled to the first channel structure at a second surface of the first gate structure, and configured to operate as a first transistor with the first gate structure and the first source/drain structure;
a second channel structure surrounded by the first gate structure;
a third source/drain structure coupled to the first channel structure at the first surface; and
a first insulation structure formed at the second surface and having a size equal to or larger than a size of the third source/drain structure.

10. The semiconductor device of claim 9, further comprising:
a second insulation structure formed between the first source/drain structure and the third source/drain structure to isolate the first source/drain structure and the third source/drain structure from each other,
wherein in a cross sectional view, an area of the first insulation structure is approximately larger an area of the second insulation structure plus an area of the third source/drain structure.

11. The semiconductor device of claim 10, wherein the third source/drain structure and the first source/drain structure are arranged in order along a direction,
along the direction, a height of the first insulation structure is larger than a height of the second insulation structure plus a height of the third source/drain structure.

12. The semiconductor device of claim 9, further comprising:
a first conductive segment coupled to the second source/drain structure, and corresponding to a first source/drain terminal of the first transistor;
a second conductive segment coupled to the first source/drain structure, and corresponding to a second source/drain terminal of the first transistor and a first source/drain terminal of a second transistor; and
a second gate structure corresponding to a gate terminal of the second transistor,
wherein the second gate structure, the second conductive segment, the first gate structure and the first conductive segment are arranged in order along a directionX direction,
the second gate structure is separated from the first gate structure by a gate pitch along the direction,
a width of the first insulation structure is approximately equal to the gate pitch along the direction, and
the first insulation structure is overlapped with the first conductive segment.

13. The semiconductor device of claim 12, wherein along the direction, a width of the first channel structure is approximately equal to a width of the second channel structure plus the width of the first insulation structure.

14. The semiconductor device of claim 12, further comprising:
a second insulation structure, wherein the second channel structure is sandwiched between the second insulation structure and the first insulation structure along the direction, and a width of the first channel structure is approximately equal to a width of the second channel structure plus the width of the first insulation structure and a width of the second insulation structure.

15. A method, comprising:

forming a substrate, a first gate structure and a second gate structure arranged in order along a first direction;

forming a first channel structure and a second channel structure which are coupled to the first gate structure and the second gate structure, respectively;

forming an isolation layer at a first boundary of the first channel structure, to isolate the first boundary during an epitaxial growth process; and forming a first source/drain structure from a second boundary of the first channel structure by the epitaxial growth process.

16. The method of claim 15, further comprising:

after the epitaxial growth process, removing the isolation layer; and after the isolation layer is removed, forming a first insulation structure at the first boundary of the first channel structure and forming a second insulation structure on the first source/drain structure simultaneously, wherein along the direction, a height of the first insulation structure is larger than a height of the second insulation structure plus a height of the first source/drain structure.

17. The method of claim 16, further comprising:

forming a second source/drain structure on the first insulation structure; and forming a third source/drain structure on the second insulation structure, wherein the second source/drain structure, the third source/drain structure and the second gate structure are configured to operate as a transistor, the second channel structure is formed between and coupled to the second source/drain structure and the third source/drain structure, and the isolation layer is further formed at a boundary of the second channel structure to isolate the second channel structure during the epitaxial growth process.

18. The method of claim 15, further comprising:

before the epitaxial growth process, forming a filling structure on a first substrate portion of the substrate, wherein forming the isolation layer comprises forming a first isolation portion on a second substrate portion of the substrate, the first channel structure is formed between the first substrate portion and the second substrate portion along a second directionX direction different from the first direction, and along the first direction, the first isolation portion is lower than an upper boundary of the filling structure.

19. The method of claim 18, wherein forming the isolation layer further comprises:

forming a second isolation portion at the first boundary of the first channel structure; and forming a third isolation portion at a second channel structure, wherein the first channel structure, the second isolation portion, the third isolation portion and the second channel structure are arranged in order along the second direction, and two terminals of the first isolation portion is connected to the second isolation portion and the third isolation portion, respectively.

20. The method of claim 19, wherein the first isolation portion extends along the second direction, and each of the second isolation portion and the third isolation portion extends along the first direction.

* * * * *